US008218099B2

(12) United States Patent
Yamazaki et al.

(10) Patent No.: US 8,218,099 B2
(45) Date of Patent: Jul. 10, 2012

(54) LIQUID CRYSTAL DISPLAY DEVICE AND METHOD FOR MANUFACTURING THE SAME

(75) Inventors: Shunpei Yamazaki, Setagaya (JP); Masayuki Sakakura, Tochigi (JP); Junichiro Sakata, Atsugi (JP); Masashi Tsubuku, Atsugi (JP); Kengo Akimoto, Atsugi (JP); Miyuki Hosoba, Isehara (JP); Yoshiaki Oikawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 15 days.

(21) Appl. No.: 12/871,162

(22) Filed: Aug. 30, 2010

(65) Prior Publication Data

US 2011/0058116 A1 Mar. 10, 2011

(30) Foreign Application Priority Data

Sep. 4, 2009 (JP) ................................ 2009-204821

(51) Int. Cl.
 *G02F 1/136* (2006.01)
(52) U.S. Cl. ................ 349/43; 349/19; 349/33; 349/41; 349/42; 349/44
(58) Field of Classification Search ................ 349/19, 349/33, 41, 42, 43, 44, 45
See application file for complete search history.

(56) References Cited

U.S. PATENT DOCUMENTS

| 5,499,124 A * | 3/1996 | Vu et al. ........................ 349/45 |
| 5,534,722 A * | 7/1996 | Takasu et al. ................. 257/347 |
| 5,731,856 A | 3/1998 | Kim et al. |
| 5,744,864 A | 4/1998 | Cillessen et al. |
| 6,294,274 B1 | 9/2001 | Kawazoe et al. |
| 6,476,784 B2 * | 11/2002 | Zavracky et al. ............... 345/88 |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |

(Continued)

FOREIGN PATENT DOCUMENTS

EP 1737044 A 12/2006

(Continued)

OTHER PUBLICATIONS

International Search Report (Application No. PCT/JP2010/063784) Dated Oct. 19, 2010.

(Continued)

*Primary Examiner* — Jennifer Doan
(74) *Attorney, Agent, or Firm* — Eric J. Robinson; Robinson Intellectual Property Law Office, P.C.

(57) ABSTRACT

An object is to provide an active matrix liquid crystal display device in which plural kinds of circuits are formed over one substrate and plural kinds of thin film transistors are provided corresponding to characteristics of the plural kinds of circuits. An inverted-coplanar thin film transistor including an oxide semiconductor layer which is over and overlaps with a source electrode layer and a drain electrode layer is used for a pixel thin film transistor. A channel-protective thin film transistor is used for a driver-circuit thin film transistor is used. In addition, main parts of the pixel thin film transistor are formed using a light-transmitting material, so that the aperture ratio is increased.

27 Claims, 17 Drawing Sheets

U.S. PATENT DOCUMENTS

| | | |
|---|---|---|
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,719,185 B2 | 5/2010 | Jin et al. |
| 7,732,819 B2 | 6/2010 | Akimoto et al. |
| 7,745,798 B2 | 6/2010 | Takahashi |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0111663 A1 | 6/2003 | Yagi |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0044701 A1 | 2/2010 | Sano et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0283049 A1 | 11/2010 | Sato et al. |
| 2011/0031496 A1 | 2/2011 | Yamazaki et al. |
| 2011/0049510 A1 | 3/2011 | Yamazaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-029293 | 1/2003 |
| JP | 2003-086000 | 3/2003 |
| JP | 2003-086000 A | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2007-081362 | 3/2007 |
| JP | 2007-096055 | 4/2007 |
| JP | 2007-123861 | 5/2007 |
| JP | 2007-163467 | 6/2007 |
| JP | 2007-171932 | 7/2007 |
| JP | 2009-265271 | 11/2009 |
| JP | 2010-098280 | 4/2010 |
| WO | WO 2004/114391 | 12/2004 |
| WO | WO-2008/105347 | 9/2008 |
| WO | WO-2008/126879 | 10/2008 |
| WO | WO-2009/072532 | 6/2009 |

OTHER PUBLICATIONS

Written Opinion (Application No. PCT/JP2010/063784) Dated Oct. 19, 2010.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, Or Al; B: Mg, Mn, Fe, Ni, Cu, or Zn] at Temperatures Over 1000°C" Journal of Solid State Chemistry, 1985, vol. 60, pp. 382-384.

Kimizuka et al., "Syntheses and Single-Crystal Data of Homologous Compounds, $In_2O_3(ZnO)m$ ($m$ = 3, 4, and 5), $InGaO_3(ZnO)_3$, and $Ga_2O_3(ZnO)m$ ($m$ = 7, 8, 9, and 16) in the $In_2O_3$-$ZnGa_2O_4$-ZnO System," Journal of Solid State Chemistry, Apr. 1, 1995, vol. 116, No. 1, pp. 170-178.

Nakamura et al., "The Phase Relations in the $In_2O_3$-$Ga_2ZnO_4$-ZnO System at 1350°C," Journal of Solid State Chemistry, Aug. 1, 1991, vol. 93, No. 2, pp. 298-315.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13th International Display Workshops, Dec. 7, 2006, pp. 663-666.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Tsuda et al., "Ultra Low Power Consumption Technologies for Mobile TFT-LCDs," IDW '02: Proceedings of the 9th International Display Workshops, Dec. 4, 2002, pp. 295-298.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display Using CG-Silicon Technology," SID Digest '04: SID International Symposium Digest of Technical Papers, 2004, vol. 35, pp. 860-863.

Kurokawa et al., "UHF RFCPUS on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel using IGZO Oxide TFT," SID Digest '08: SID International Symposium Digest of Technical Papers, May 20, 2008, vol. 39, pp. 625-628.

Park et al., "Challenge to Future Displays: Transparent AM-OLED Driven by PEALD Grown ZnO TFT," IMID '07 Digest, 2007, pp. 1249-1252.

Park et al., "Amorphous Indium-Gallium-Zinc Oxide TFTs and their Application for Large Size AMOLED," AM-FPD '08 Digest of Technical Papers, Jul. 2, 2008, pp. 275-277.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 2, 2002, vol. 1, pp. 64-68.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Park et al., "High performance amorphous oxide thin film transistors with self-aligned top-gate structure," IEDM 09: Technical Digest of International Electron Devices Meeting, Dec. 7, 2009, pp. 191-194.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Prins et al., "A Ferroelectric Transparent Thin-Film Transistor," Appl. Phys. Lett. (Applied Physics Letters), Jun. 17, 1996, vol. 68, No. 25, pp. 3650-3652.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Ohara et al., "21.3: 4.0 IN. QVGA AMOLED Display Using In-Ga-Zn-Oxide TFTs with a Novel Passivation Layer," SID Digest '09: SID International Symposium Digest of Technical Papers, May 31, 2009, pp. 284-287.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Osada et al., "Development of Driver-Integrated Panel using Amorphous In-Ga-Zn-Oxide TFT," AM-FPD '09 Digest of Technical Papers, Jul. 1, 2009, pp. 33-36.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Sakata et al., "Development of 4.0-In. AMOLED Display with Driver Circuit Using Amorphous In-Ga-Zn-Oxide TFTS," IDW '09: Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Nakamura, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

FIG. 5A1
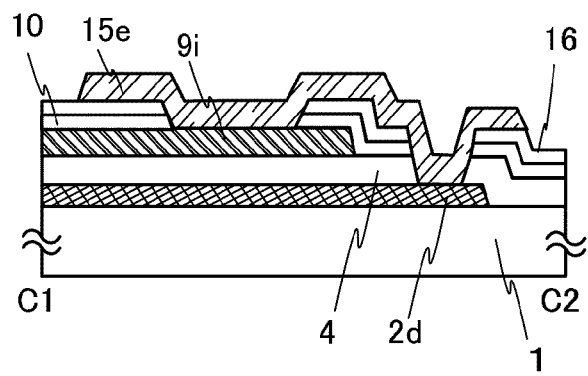
FIG. 5A2
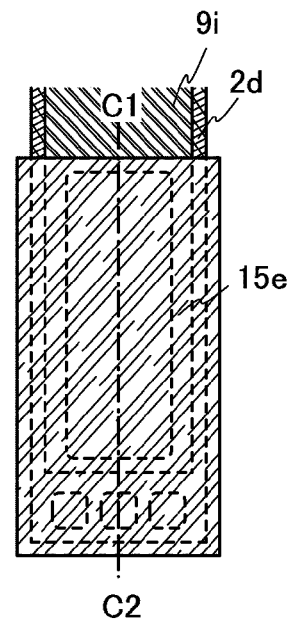
FIG. 5B1
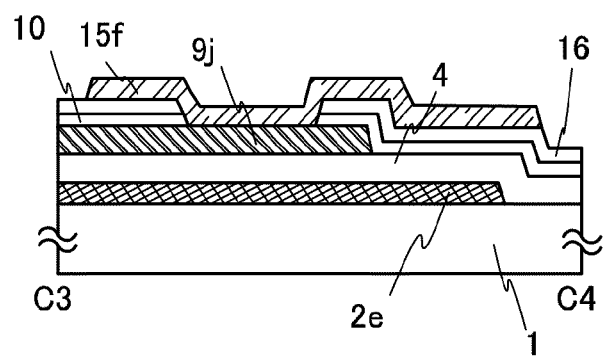
FIG. 5B2
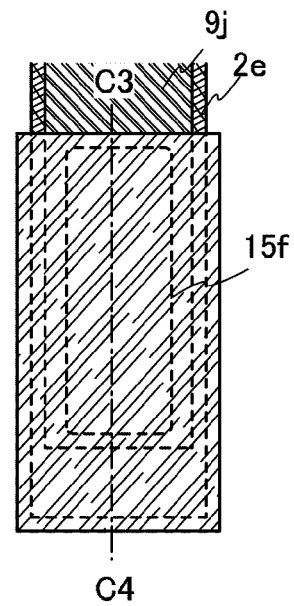

LIQUID CRYSTAL DISPLAY DEVICE AND METHOD FOR MANUFACTURING THE SAME

TECHNICAL FIELD

The present invention relates to an active matrix liquid crystal display device and a method for manufacturing the same. The present invention further relates to an electronic appliance in which the active matrix liquid crystal display device is mounted as a component.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide range of electronic devices such as ICs or electro-optical devices, and prompt development of thin film transistors that are to be used as switching elements in image display devices, in particular, is being pushed. Various metal oxides are used for a variety of applications. Of them, indium oxide is a well-known material and is used as a transparent electrode material which is necessary for liquid crystal displays and the like.

Note that a thin film transistor is an element having at least three terminals of a gate, a drain, and a source. The thin film transistor has a channel region between a drain region and a source region, and current can flow through the drain region, the channel region, and the source region. In this specification, the term "source" and the term "drain" are not distinguished. When one of terminals functioning as a source or drain is referred to as "source", the other is referred to as "drain".

Some metal oxides have semiconductor characteristics. Metal oxides having semiconductor characteristics include, for example, tungsten oxide, tin oxide, indium oxide, zinc oxide, and the like. A thin film transistor including an oxide semiconductor has high field-effect mobility. Thus, with use of the thin film transistor, a driver circuit for a display device or the like can be formed. A thin film transistor in which a channel formation region is formed using such a metal oxide having semiconductor characteristics is already known (Patent Documents 1 and 2).

REFERENCE

[Patent Document 1] Japanese Published Patent Application No. 2007-123861
[Patent Document 2] Japanese Published Patent Application No. 2007-096055

DISCLOSURE OF INVENTION

In the case where a plurality of circuits which are different from each other are formed over an insulating surface, for example, in the case where a pixel portion and a driver circuit are formed over one substrate, excellent switching characteristics (e.g., a high on-off ratio) are required for a thin film transistor in the pixel portion, and a high operation speed is required for a thin film transistor in the driver circuit. The thin film transistor in the driver circuit preferably operates at high speed as the definition of a display device is increased, because writing time of a display image is reduced particularly.

An object is to provide an active matrix liquid crystal display device in which plural kinds of circuits are formed over one substrate and plural kinds of thin film transistors are provided corresponding to characteristics of the plural kinds of circuits.

Further, another object is to reduce variation in electric characteristics of thin film transistors including oxide semiconductor films in the above active matrix liquid crystal display device.

One embodiment of the present invention is an active matrix display device including a driver circuit portion and a display portion (also referred to as a pixel portion) over one substrate. The driver circuit portion includes: a thin film transistor for a driver circuit (driver-circuit thin film transistor), in which a gate electrode layer, a source electrode layer, and a drain electrode layer are formed using a metal conductive film and a semiconductor layer is formed using an oxide semiconductor; and a wiring for a driver circuit, which is formed using a metal conductive film. The display portion includes a thin film transistor for a pixel (hereinafter, referred to as pixel thin film transistor) in which a source electrode layer and a drain electrode layer are formed using an oxide conductor and a semiconductor layer is formed using an oxide semiconductor.

As each of the pixel thin film transistor and the driver-circuit thin film transistor, a thin film transistor with a bottom-gate structure is used. The pixel thin film transistor is an inverted-coplanar (also referred to as a bottom-contact) thin film transistor in which an oxide semiconductor layer is provided to be over and overlap with the source electrode layer and the drain electrode layer.

According to the present invention, an active matrix liquid crystal display device in which a plurality of pixel electrodes are provided over one substrate and pixel thin film transistors electrically connected to the pixel electrodes are formed can be manufactured.

The above active matrix liquid crystal display device can be a full-color liquid crystal display device by employing such a structure that liquid crystals are sandwiched between the substrate over which an active matrix circuit is formed and a substrate (counter substrate) which faces the substrate and is provided with an optical film, specifically, a color filter and a light source emitting white light. In the case where display is performed by light emission passing through the color filter as described, a gate electrode layer, a source electrode layer, and a drain electrode layer of the pixel thin film transistor are formed using a light-transmitting conductive film, whereby aperture ratio can be increased. Here, the color filter refers not to a whole of a film including color filter layers with three colors (e.g., a red color filter, a blue color filter, and a green color filter) in addition to a black matrix and/or an overcoat but to a color filter with one color.

The driver-circuit thin film transistor has a structure different from the pixel thin film transistor, and is a bottom-gate thin film transistor in which an oxide insulating layer is provided to be in contact with an oxide semiconductor layer exposed between a source electrode layer and a drain electrode layer.

In the driver-circuit thin film transistor, a drain electrode layer is formed using a metal conductive film such as a Ti film to be partly in contact with an upper surface of the oxide semiconductor layer, so that a high-resistance drain region (also referred to as an HRD region) which is an oxygen-deficient region is formed in a portion overlapping with the drain electrode layer. Specifically, the carrier concentration of the high resistance drain region is within the range of from $1\times10^{18}/cm^3$ to $1\times10^{21}/cm^3$ inclusive (preferably, from $1\times10^{18}/cm^3$ to $1\times10^{20}/cm^3$ inclusive), which is at least higher than the carrier concentration of a channel formation region (equal to or higher than $1\times10^{14}/cm^3$ and lower than $1\times10^{18}/cm^3$). Note that a value of the carrier concentration in this specification is obtained by Hall effect measurement at room temperature.

Further, the source electrode layer is partly in contact with the upper surface of the oxide semiconductor layer, so that a high-resistance source region (also referred to as an HRS region) which is an oxygen-deficient region is formed in a portion overlapping with the source electrode layer.

One embodiment of the present invention disclosed in this specification is an active matrix liquid crystal display device which includes a pixel portion including a first thin film transistor and a driver circuit including a second thin film transistor having a structure different from the first thin film transistor over one substrate. The first thin film transistor includes a gate electrode layer over the substrate, a gate insulating layer over the gate electrode layer, a source electrode layer and a drain electrode layer over the gate insulating layer, an oxide semiconductor layer which is over the gate insulating layer and overlaps with the source electrode layer and the drain electrode layer, an oxide insulating layer in contact with the oxide semiconductor layer, and a pixel electrode layer which is over the oxide insulating layer and electrically connected to the drain electrode layer. In the first thin film transistor, at least one of the gate electrode layer, the gate insulating layer, the oxide semiconductor layer, the source electrode layer, the drain electrode layer, and the oxide insulating layer has a light-transmitting property.

With the above structure, at least one of the above problems can be resolved.

Note that the ordinal numbers such as "first" and "second" in this specification are used for convenience and do not denote the order of steps and the stacking order of layers. In addition, the ordinal numbers in this specification do not denote particular names which specify the present invention.

In the above structure, a connection electrode layer may be provided between the pixel electrode layer and the drain electrode layer. The connection electrode layer may be formed from a metal film containing an element selected from Al, Cr, Cu, Ta, Ti, Mo, and W as its main component, an alloy film containing any of the elements, or a stacked film including a combination of any of the elements. Further, the source electrode layer and the drain electrode layer of the first thin film transistor may be formed using indium oxide, indium tin oxide, indium zinc oxide, or zinc oxide.

A source electrode layer and a drain electrode layer of the second thin film transistor that is a driver-circuit thin film transistor are formed using a metal material such as an element selected from Ti, Mo, W, Al, Cr, Cu, and Ta, an alloy including any of the elements as a component, an alloy including a combination of any of the elements, and the like. Each of the source electrode layer and the drain electrode layer is not limited to a single layer containing the above-described element but can be a stack of two or more layers.

Further, the second thin film transistor has a structure in which the source electrode layer and the drain electrode layer do not overlap with a channel formation region of an oxide semiconductor layer. Furthermore, the width of the oxide insulating layer functioning as a channel protective layer is smaller than the distance between a side surface of the source electrode layer and a side surface of the drain electrode layer which faces the side surface of the source electrode layer. When the oxide insulating layer functioning as the channel protective layer is designed to have a small width (length in a channel length direction) for higher speed operation of the driver-circuit thin film transistor, the distance between the side surface of the source electrode layer and the side surface of the drain electrode layer which faces the side surface of the source electrode layer is also be reduced, which could allow short-circuit of the source electrode layer and the drain electrode layer. Therefore, increasing the distance between the side surfaces is effective. In addition, with use of the thin film transistor operating at high speed, integration degree of the circuits is improved.

In the above structure, the second thin film transistor includes the oxide semiconductor layer and the oxide insulating layer over the oxide semiconductor layer, and the channel formation region and a peripheral portion of the oxide semiconductor layer are in contact with the oxide insulating layer. The oxide insulating layer which is over and in contact with the channel formation region of the oxide semiconductor layer functions as a channel protective layer.

Further, in the above structure, an inorganic insulating film formed by a method using sputtering is used for the oxide insulating layer functioning as the channel protective layer of the driver-circuit thin film transistor. Typically, a silicon oxide film, a silicon nitride oxide film, an aluminum oxide film, an aluminum oxynitride film, or the like is used.

Alternatively, the second thin film transistor may have a structure in which oxide conductive layers are provided in respective portions between the oxide semiconductor layer and the source electrode layer and between the oxide semiconductor layer and the drain electrode layer. Such a structure enables contact resistance to be reduced, with which a transistor capable of high speed operation can be manufactured. Note that the oxide conductive layer preferably contains as a component zinc oxide but no indium oxide. Such an oxide conductive layer can be formed using zinc oxide, zinc aluminum oxide, zinc aluminum oxynitride, or zinc gallium oxide.

The oxide semiconductor layer of the driver-circuit thin film transistor has a region, i.e., a third region, in which the upper surface of the oxide semiconductor layer does not overlap with the oxide insulating layer, the drain electrode layer, nor the source electrode layer. The length of this third region in the channel length direction depends on a position where the oxide semiconductor layer is patterned and a position where the drain electrode layer and the source electrode layer are patterned. When this third region has a large length in the channel length direction, an off current of the driver-circuit thin film transistor can be reduced. In contrast, when this third region has a small length in the channel length direction, the operation (switching) speed of the driver-circuit thin film transistor can be increased.

An insulating layer in contact with the third region is also formed from an inorganic insulating film formed by a physical deposition method such as a sputtering method. Typically a silicon nitride film, a silicon nitride oxide film, an aluminum nitride film, or the like is used. In this deposition, a film to be formed is desired to have the sufficiently low hydrogen concentration by reducing the hydrogen concentration (not only the concentration of a hydrogen molecule existing independently but also the concentration of hydrogen contained in compounds) as much as possible in an atmosphere or a deposition material. Specifically, the preferable hydrogen concentration in the film to be formed is from $1\times10^{12}$ atoms/cm$^3$ to $1\times10^{18}$ atoms/cm$^3$ inclusive.

Note that the oxide semiconductor layer may be formed using a thin film represented by $InMO_3(ZnO)_m$ (m>0 and m is not an integer), and with use of such a thin film for the oxide semiconductor layer, a thin film transistor may be manufactured. Note that M denotes one metal element or a plurality of metal elements selected from Ga, Fe, Ni, Mn, and Co. As an example, M may be Ga or may include the above metal element in addition to Ga, for example, M may be Ga and Ni or Ga and Fe. Moreover, in the above oxide semiconductor, in some cases, a transition metal element such as Fe or Ni or an oxide of the transition metal is contained as an impurity element in addition to a metal element contained as M. In this specification, for example, an oxide semiconductor including In, Ga, and Zn is referred to as an In—Ga—Zn—O-based oxide semiconductor, and a thin film thereof is referred to as an In—Ga—Zn—O-based film. The In—Ga—Zn—O-based oxide semiconductor may include another element.

As a metal oxide applied to the oxide semiconductor layer, any of the following oxide semiconductors can be applied besides the above: an In—Sn—O-based metal oxide, an In—Ga—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. Silicon may be included in the oxide semiconductor layer formed using the above metal oxide.

One embodiment of the present invention to realize the above structure is a method for manufacturing an active matrix liquid crystal display device including the steps of forming a first gate electrode layer and a second gate electrode layer over a substrate having an insulating surface; forming a gate insulating layer over the first gate electrode layer and the second gate electrode layer; forming a first source electrode layer and a first drain electrode layer over the gate insulating layer to overlap with the first gate electrode layer; forming a first oxide semiconductor layer and a second oxide semiconductor layer over the gate insulating layer, the first oxide semiconductor layer overlapping with the first gate electrode layer, a part of the first source electrode layer, and a part of the first drain electrode layer, and the second oxide semiconductor layer overlapping with the second gate electrode layer; forming an oxide insulating layer which is in contact with a part of the first oxide semiconductor layer and an upper surface and a side surface of the second oxide semiconductor layer; forming a second source electrode layer and a second drain electrode layer over the second oxide semiconductor layer; and forming a pixel electrode layer over the oxide insulating layer to be electrically connected to the first drain electrode layer.

In the structure of the above manufacturing step, the oxide insulating layer in contact with the first oxide semiconductor layer and the second oxide semiconductor layer is formed after performance of dehydration or dehydrogenation of the oxide semiconductor layers, without being exposed to air so as to prevent reincorporation of water and hydrogen into the oxide semiconductor layers.

In this specification, "dehydrogenation" does not indicate elimination of only $H_2$ by heat treatment. For convenience, elimination of H, OH, and the like is referred to as "dehydration or dehydrogenation".

The oxide semiconductor layer contains more or less hydrogen or water, which depends on a film-formation method, and some of the contained hydrogen or water serves as a donor supplying an electron. In the case where heat treatment is performed in an atmosphere of an inert gas such as nitrogen or a rare gas (such as argon or helium), hydrogen or water contained in the oxide semiconductor layer is eliminated. In addition, by this heat treatment, the oxide semiconductor layer becomes of an oxygen-deficient type, so that the oxide semiconductor layer is turned into a low-resistance oxide semiconductor layer, that is, an n-type ($n^-$-type or the like) oxide semiconductor layer.

After that, the oxide insulating film in contact with the oxide semiconductor layer is formed, whereby the oxide semiconductor layer is made to be in an oxygen-excess state; accordingly, a high-resistance oxide semiconductor layer, that is, an i-type oxide semiconductor layer is provided. As a result, a semiconductor device including a thin film transistor having high electric characteristics and high reliability can be provided.

As dehydration or dehydrogenation, heat treatment is performed in an atmosphere of an inert gas such as nitrogen or a rare gas (such as argon or helium) at a temperature higher than or equal to 350° C., preferably higher than or equal to 425° C. and lower than or equal to 700° C., so that impurities such as moisture included in the oxide semiconductor layers are reduced.

When by using thermal desorption spectroscopy (TDS), a gas is analyzed (at a temperature in a range from room temperature to 450° C.), which is discharged from the oxide semiconductor layer which has been subjected to dehydration or dehydrogenation adequately, at least one peak at around 300° C. of two peaks indicating discharge of water is not detected.

Note that it is preferable that temperature be lowered from the heat temperature at which dehydration or dehydrogenation is performed on the oxide semiconductor layer to the room temperature while the oxide semiconductor layer is continuously kept in a furnace where the dehydration or dehydrogenation is performed, without being exposed to air so as to prevent reincorporation of water or hydrogen into the oxide semiconductor layer. Moreover, performance of dehydration or dehydrogenation causes oxygen deficiency in the oxide semiconductor layer (that is, makes an oxygen-deficient type), so that the oxide semiconductor layer is turned into a low-resistance (i.e., n-type) oxide semiconductor layer. Then, by formation of an oxide insulating film in contact with the oxide semiconductor layer, resistance of the oxide semiconductor layer is increased; that is, an i-type oxide semiconductor layer is obtained. When a thin film transistor is formed with use of such an oxide semiconductor layer, the threshold voltage (Vth) of the thin film transistor has a positive value; thus, a so-called normally-off switching element can be realized. It is desirable for a thin film transistor used in a display device that a channel be formed with a threshold voltage that is a positive value and as close to 0 V as possible.

Note that if the threshold voltage of the thin film transistor is negative, the thin film transistor is likely to be in the so-called normally-on state; in other words, current flows between a source electrode and a drain electrode even when the gate voltage is 0 V. In an active-matrix display device, electric characteristics of thin film transistors included in a circuit are important and performance of the display device is dependent on the electric characteristics.

Among the electric characteristics of the thin film transistor, the threshold voltage is particularly important. In the case of taking an n-channel thin film transistor as an example, when the threshold voltage is significantly high or a negative value even though the field-effect mobility is high, it is difficult to control the circuit. The thin film transistor whose threshold value is high cannot function as a switch at low driving voltage and may be a load.

In the case of an n-channel thin film transistor, it is preferable that a channel be not formed by application of a voltage of 0V but formed by application of a positive value of +1 V to +5V and then the drain current begin to flow. Neither a transistor in which a channel is not formed unless the driving voltage is increased to +10 V or higher nor a transistor in which a channel is formed and drain current flows even by application of a negative voltage is suitable for a thin film transistor used in a circuit.

An atmosphere while the temperature is decreased to room temperature from the heat temperature at which dehydration or dehydrogenation is performed may be changed into a gas atmosphere different from the gas atmosphere of heat treatment. For example, dehydration or dehydrogenation is performed in a nitrogen atmosphere, and then cooling may be performed by filling the furnace with a high-purity oxygen gas, a high-purity $N_2O$ gas, or an ultra-dry air (with a dew point of −40° C. or lower, preferably −60° C. or lower).

The electric characteristics of a thin film transistor are improved using an oxide semiconductor film cooled slowly (or cooled) in a dry atmosphere which does not substantially contain moisture (having a dew point of −40° C. or lower, preferably −60° C. or lower) after moisture contained in a film is reduced by heat treatment for performing dehydration or dehydrogenation, and high-performance thin film transistors which can be mass-produced are realized.

In some active matrix display devices whose pixel portion includes a plurality of thin film transistors, the pixel portion has a portion where a gate electrode of one thin film transistor is connected to a source wiring or a drain wiring of another thin film transistor. Alternatively, in some active matrix display devices whose driver circuit includes thin film transistors, there is a portion where a gate electrode of one thin film transistor is connected to a source wiring or a drain wiring of the thin film transistor.

Since a thin film transistor is easily broken due to static electricity or the like, a protective circuit for protecting the thin film transistor in the pixel portion is preferably provided over the same substrate for a gate line or a source line. The protective circuit is preferably formed with a non-linear element including an oxide semiconductor layer.

In a semiconductor device of one embodiment of the present invention, a driver circuit portion including a driver-circuit thin film transistor and a pixel portion including a pixel thin film transistor are formed over one substrate. Thus, the cost for manufacturing the active matrix display device can be reduced.

With use of an oxide semiconductor layer subjected to heat treatment for performing dehydration or dehydrogenation, a high-reliable active matrix display device in which a high-reliable thin film transistor with excellent electric characteristics serves as a switching element can be manufactured. Moreover, an active matrix display device can be manufactured, in which a pixel thin film transistor and a driver-circuit thin film transistor are formed over one substrate, and the thin film transistors have structures corresponding to the respective circuits.

BRIEF DESCRIPTION OF DRAWINGS

FIGS. 5A1 and 5B1 are cross-sectional views and FIGS. 5A2 and 5B2 are plan views illustrating one embodiment of the present invention.

BEST MODE FOR CARRYING OUT THE INVENTION

Figure 1A:
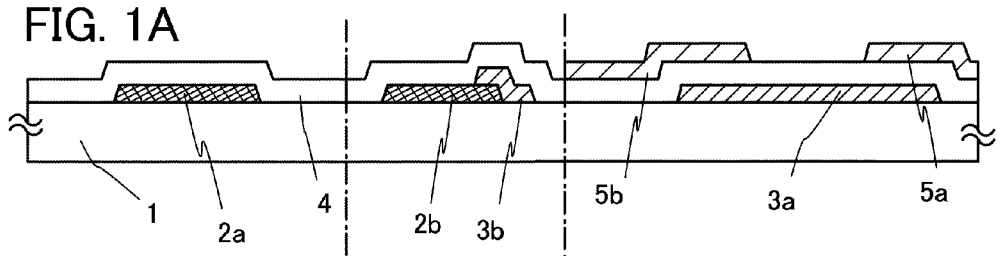
FIGS. 1A to 1E are cross-sectional process views illustrating one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. Note that in the drawings of this specification, the identical portions or portions having a similar function are denoted by the identical reference numerals, and description thereon may be omitted.

Embodiment 1

In this embodiment, one embodiment of an active matrix display device and a manufacturing method thereof is described with reference to FIGS. 1A to 1E. FIG. 1E illustrates an example of cross-sectional structures of two thin film transistors having different structures manufactured over one substrate.

A thin film transistor 12 illustrated in FIG. 1E has one of bottom-gate structures. Further, a thin film transistor 13 has one of bottom-gate structures called a bottom-contact type (also referred to as an inverted-coplanar type).

The thin film transistor 13 provided in a pixel includes a gate electrode layer 3a, a gate insulating layer 4, an oxide semiconductor layer 8b including a channel formation region, a source electrode layer 5a, and a drain electrode layer 5b, over a substrate 1 having an insulating surface. In addition, an oxide insulating layer 7b which covers the thin film transistor 13 and is in contact with an upper surface and a side surface of the oxide semiconductor layer 8b is provided.

Further, the thin film transistor 13 provided in the pixel is described as a single gate thin film transistor; however, a multi-gate thin film transistor including a plurality of channel formation regions can be used as necessary.

Note that the oxide semiconductor layer 8b is formed over and partly overlaps with the source electrode layer 5a and the drain electrode layer 5b. The oxide semiconductor layer 8b overlaps with the gate electrode layer 3a with the gate insulating layer 4 interposed therebetween. The channel formation region of the thin film transistor 13 provided in the pixel is a region of the oxide semiconductor layer 8b, which is between a side surface of the source electrode layer 5a and a side surface of the drain electrode layer 5b, which faces the side surface of the source electrode layer 5a, that is, a region which is in contact with the gate insulating layer 4 and overlaps with the gate electrode layer 3a.

In order to realize a liquid crystal display device having a high aperture ratio using a light-transmitting thin film transistor as the thin film transistor 13, the source electrode layer 5a and the drain electrode layer 5b are formed using a light-transmitting conductive film.

Moreover, a light-transmitting conductive film is also used for the gate electrode layer 3a in the thin film transistor 13. In this specification, a film having a light-transmitting property with respect to visible light is a film with a thickness of which transmittance is 75% to 100% inclusive. When the film has conductivity, the film is also referred to as a transparent conductive film. Alternatively, a conductive film which is semi-transparent to visible light may be used. Semi-transparency to visible light means that the visible light transmittance is equal to or higher than 50% and lower than 75%.

Further, the thin film transistor 12 provided in a driver circuit includes a gate electrode layer 2a, the gate insulating layer 4, an oxide semiconductor layer 6a, a source electrode layer 9a, and a drain electrode layer 9b, over the substrate 1 having an insulating surface. The oxide semiconductor layer 6a includes at least a channel formation region 8a, a high-resistance source region 11a, and a high-resistance drain region 11b. Further, an oxide insulating layer 7a in contact with the channel formation region 8a is also provided. An insulating layer 10 is provided over the source electrode layer 9a and the drain electrode layer 9b.

A first region 11c and a second region 11d in the oxide semiconductor layer 6a which overlap with the oxide insulating layer 7b are in an oxygen-excess state like the channel formation region 8a, and serve to reduce leakage current and parasitic capacitance. A third region 11e in the oxide semiconductor layer 6a, which is in contact with the insulating layer 10, is provided between the channel formation region 8a and the high-resistance source region 11a. A fourth region 11f in the oxide semiconductor layer 6a, which is in contact with the insulating layer 10, is provided between the channel formation region 8a and the high-resistance drain region 11b. The third region 11e and the fourth region 11f in the oxide semiconductor layer 6a which are in contact with the insulating layer 10 enable a reduction in off current.

In general, in a channel-protective thin film transistor, a source electrode layer and a drain electrode layer are formed to overlap with a channel protective layer. In such a structure, the width of the channel protective layer is required to be narrowed so as to shorten a channel length L of a channel formation region. However, when the source electrode layer and the drain electrode layer are provided over the channel protective layer with a narrow width, the source electrode layer and the drain electrode layer may be short-circuited over the channel protective layer. In this embodiment, the above problem can be solved by employing a structure in which the oxide insulating layer 7a with a narrow width which functions as a channel protective layer, the source electrode layer 9a, and the drain electrode layer 9b do not overlap with each other.

Note that in FIG. 1E, a region of the oxide semiconductor layer 6a, which is sandwiched together with the gate insulating layer, between the oxide insulating layer 7a and the gate electrode layer 2a is referred to as a channel formation region. Therefore, the channel length L of the thin film transistor 12 is equal to the length of the oxide insulating layer 7a in the channel length direction. Note that the oxide insulating layer 7a is illustrated to have a trapezoid shape in the cross-sectional view in FIG. 1E, and the channel length L of the thin film transistor 12 is the length of the base of the trapezoid.

Hereinafter, a process for manufacturing the thin film transistors 12 and 13 over one substrate will be described with reference to FIGS. 1A to 1E.

First, after a conductive film is formed over the substrate 1 having an insulating surface, the gate electrode layers 2a and 2b are formed by a first photolithography step. Note that instead of this step, a method in which a resist mask is formed by an inkjet method may be employed. A photomask is not used when the resist mask is formed by an inkjet method, which results in reducing manufacturing cost.

As a material of the gate electrode layers 2a and 2b, there are metal containing an element selected from Al, Cr, Ta, Ti, Mo, or W as its main component, an alloy including the above element, an alloy including any of these elements in combination, and the like.

In the case where a glass substrate is used as the substrate 1, the one whose strain point is 730° C. or higher may be used in the case where the temperature of the heat treatment to be performed later is high. As the glass substrate, a glass material such as aluminosilicate glass, aluminoborosilicate glass, or barium borosilicate glass is used, for example. Alternatively, crystallized glass or the like may be used.

Note that in general, by containing a larger amount of barium oxide (BaO) than that of boric acid, a heat-resistant glass substrate which is more practical can be obtained. Therefore, a glass substrate containing a larger amount of BaO than that of $B_2O_3$ is preferably used.

Alternatively, a substrate formed of an insulator, such as a ceramic substrate, a quartz substrate, or a sapphire substrate may be used as the substrate 1.

An insulating film serving as a base film may be provided between the substrate 1 and the gate electrode layers 2a and 2b. The base film functions to prevent diffusion of an impurity element from the substrate 1 and can be formed using one film or stacked films selected from a silicon nitride film, a silicon oxide film, a silicon nitride oxide film, and a silicon oxynitride film.

Next, a conductive film having a light-transmitting property is formed so as to cover the gate electrode layers 2a and 2b and a second photolithography step is performed to form the gate electrode layer 3a and a gate electrode layer 3b. In this embodiment, in order to reduce the wiring resistance, a gate wiring provided in a pixel portion is formed using the same metal conductive film as the gate electrode layer 2b, and the conductive film having a light-transmitting property is used as a material of the gate electrode layer 3a which overlaps with the oxide semiconductor layer formed later with the gate insulating layer 4 interposed therebetween.

Next, the gate insulating layer 4 is formed over the gate electrode layers 2a, 2b, 3a and 3b. The gate insulating layer 4 can be formed to have a single layer of a silicon oxide layer, a silicon nitride layer, a silicon oxynitride layer, or a silicon nitride oxide layer or a stacked layer thereof by a physical vapor deposition (PVD) method such as a plasma CVD method or a sputtering method. For example, a silicon oxynitride layer may be formed by a plasma CVD method, using $SiH_4$, oxygen, and nitrogen as deposition gases. The thickness of the gate insulating layer 4 is greater than or equal to 100 nm and less than or equal to 500 nm In the case of using a stacked layer, for example, a first gate insulating layer with a thickness greater than or equal to 50 nm and less than or equal to 200 nm and a second gate insulating layer with a thickness greater than or equal to 5 nm and less than or equal to 300 nm are stacked.

In this embodiment, the gate insulating layer 4 is formed to have a thickness of 100 nm by a plasma CVD method using silicon oxynitride (SiON) (in which the nitrogen concentration is smaller than the oxygen concentration).

Note that it is preferable that the hydrogen concentration in the gate insulating layer 4 be sufficiently low in order to prevent hydrogen from diffusing into the oxide semiconductor layer formed thereover. Therefore, a physical vapor deposition (PVD) method such as a sputtering method, a laser ablation method (also referred to as a laser sputtering method), or a vacuum evaporation method, which can be performed in a state where hydrogen is extremely less included or not included in a deposition material or an atmosphere is preferably used.

Next, a light-transmitting conductive film is formed over the gate insulating layer 4, and then a third photolithography step is performed, so that the source electrode layer 5a and the drain electrode layer 5b are formed (see FIG. 1A). As a material of the light-transmitting conductive film, a conductive material that transmits visible light, for example, an In—Sn—O-based metal oxide, an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, or a Zn—O-based metal oxide can be employed, and the film thickness thereof is selected in the range of 50 nm to 300 nm inclusive. When a sputtering method is employed, it is preferable that deposition be performed using a target containing $SiO_2$ of 2 wt % to 10 wt % inclusive and SiOx (x>0) which inhibits crystallization be contained in the light-transmitting conductive film so as to prevent crystallization at the time of heat treatment for dehydration or dehydrogenation in a later step.

Figure 1B:
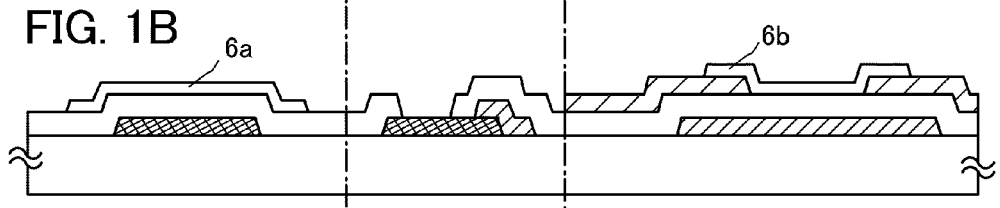
Figure 1C:
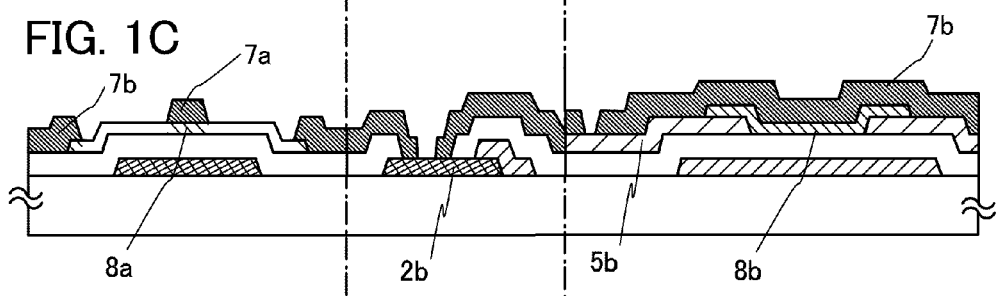

Next, the gate insulating layer 4 is selectively etched by a fourth photolithography step, so that a contact hole reaching the gate electrode layer 2b is formed as illustrated in FIG. 1B.

An oxide semiconductor film with a thickness of 5 nm to 200 nm inclusive, preferably 10 nm to 20 nm inclusive is formed over the gate insulating layer 4. When a thickness of the oxide semiconductor film is 50 nm or smaller, the oxide semiconductor film can be kept in an amorphous state even when heat treatment for dehydration or dehydrogenation is performed.

The following film is used for the oxide semiconductor film: an In—Ga—Zn—O-based oxide semiconductor film; an In—Sn—Zn—O-based oxide semiconductor film; an In—Al—Zn—O-based oxide semiconductor film; a Sn—Ga—Zn—O-based oxide semiconductor film; an Al—Ga—Zn—O-based oxide semiconductor film; a Sn—Al—Zn—O-based oxide semiconductor film; an In—Zn—O-based oxide semiconductor film; an In—Ga—O-based oxide semiconductor film; an Sn—Zn—O-based oxide semiconductor film; an Al—Zn—O-based oxide semiconductor film; an In—O-based oxide semiconductor film; a Sn—O-based oxide semiconductor film; and a Zn—O-based oxide semiconductor film. Alternatively, the oxide semiconductor film can be formed by a sputtering method in a rare gas (typically argon) atmosphere, an oxygen atmosphere, or an atmosphere including a rare gas (typically argon) and oxygen.

When a sputtering method is employed, it is preferable that deposition be performed using a target containing $SiO_2$ of 2 to 10 wt % inclusive and SiOx (x>0) which inhibits crystallization be contained in the oxide semiconductor film so as to prevent crystallization at the time of heat treatment for dehydration or dehydrogenation in a later step.

In this embodiment, film deposition is performed using an oxide semiconductor target including In, Ga, and Zn (In:Ga:Zn=1:1:0.5 [at %]) under the following condition: the distance between a substrate and a target is 100 mm, the pressure is 0.6 Pa, the direct-current (DC) power source is 0.5 kW, and the atmosphere is oxygen (the flow ratio of oxygen is 100%). Note that a pulse direct current (DC) power source is preferable because powder substances (also referred to as particles) generated in film formation can be reduced and the film thickness can be uniform. In this embodiment, an In—Ga—Zn—O-based non-single-crystal-film with a thickness of 15 nm is formed under the above conditions.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal conductive film.

In addition, there is also a multi-source sputtering apparatus in which a plurality of targets of different materials can be set. With the multi-source sputtering apparatus, films of different materials can be formed to be stacked in the same chamber, or a film can be formed by electric discharge of plural kinds of materials at the same time in the same chamber. Further, there is a reactive sputtering method in which an element sputtered by a target material reacts with a sputtering atmosphere.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by a sputtering method, there are also a reactive sputtering method in which a target substance and a sputtering gas component are chemically reacted with each other during deposition to form a thin compound film thereof, and a bias sputtering method in which a voltage is also applied to a substrate during deposition.

Any one of these methods can be employed for forming the oxide semiconductor film. Note that before the oxide semiconductor film is formed by a sputtering method, moisture, organic substances, dust, or the like on a surface of the gate insulating layer 4 is preferably removed by reverse sputtering in which an argon gas is introduced and plasma is generated. The reverse sputtering refers to a method in which, without application of voltage to a target side, an RF power source is used for application of voltage to a substrate side so that plasma is generated around the substrate to modify a surface. Note that instead of an argon atmosphere, nitrogen, helium, oxygen, or the like may be used. The reverse sputtering may be performed before other deposition steps, without being limited to a step before the oxide semiconductor film is formed.

Note that in this embodiment, the gate insulating layer is selectively etched by the fourth photolithography step to form the contact hole reaching the gate electrode layer 2b; however, the present invention is not particularly limited thereto. A contact hole reaching the gate electrode layer 2b may be formed by using a resist mask formed over an oxide semiconductor layer formed by etching the oxide semiconductor film; in that case, it is preferable that the reverse sputtering be performed to remove resist residue or the like attached on the surface of the oxide semiconductor layer and the gate insulating layer 4.

Alternatively, the following may be performed; an oxide semiconductor film is formed over the gate insulating layer, a resist mask is formed over the oxide semiconductor film, a contact hole reaching the gate electrode layer 2b is formed, and then, the resist mask is removed, and after that, a resist mask is formed again on the oxide semiconductor film, and the oxide semiconductor film is selectively etched to be island-shaped oxide semiconductor layers.

In this embodiment, the contact hole reaching the gate electrode layer 2b is formed by selectively etching the gate insulating layer 4 by the fourth photolithography step; therefore, it is preferable that the oxide semiconductor film be formed after heat treatment (at greater than or equal to 400° C.) may be performed in an inert gas atmosphere (nitrogen, or helium, neon, argon, or the like) after the contact hole is formed to remove impurities such as hydrogen and water contained in the gate insulating layer 4.

Then, the oxide semiconductor film is processed into island-shaped oxide semiconductor layers by a fifth photolithography step. The resist mask for forming the island-shaped oxide semiconductor layers may be formed by an inkjet method. A photomask is not used when the resist mask is formed by an inkjet method, which results in reducing manufacturing cost. The etching of the oxide semiconductor film may be either of wet etching or dry etching.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As a dry etching method, a parallel plate RIE (reactive ion etching) method or an ICP (inductively coupled plasma) etching method can be used. In order to etch the film into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid can be used. In addition, ITO07N (produced by KANTO CHEMICAL CO., INC.) may also be used.

The etchant used in the wet etching is removed together with the etched materials by cleaning. The waste liquid of the etchant including the removed materials may be purified and the materials may be reused. When a material such as indium included in the oxide semiconductor layer is collected from the waste liquid after the etching and reused, the resources can be efficiently used and the cost can be reduced.

In order to etch the film into desired shapes, etching conditions (such as etchant, etching time, and temperature) are adjusted as appropriate depending on the material.

Next, the oxide semiconductor layers are subjected to dehydration or dehydrogenation. First heat treatment for dehydration or dehydrogenation is performed at a temperature of 400° C. or higher and lower than 700° C., preferably, 425° C. or higher. Note that the heat treatment may be performed for one hour or shorter when the temperature thereof is higher than or equal to 425° C., although the heat treatment is preferably performed for longer than one hour when the temperature is lower than 425° C.

Here, after the substrate is introduced into an electric furnace, which is one of heat treatment apparatuses, and the oxide semiconductor layer is subjected to heat treatment in a nitrogen atmosphere, reincorporation of water and hydrogen into the oxide semiconductor layer is prevented by cooling the oxide semiconductor layer without being exposed to the air. In this embodiment, one furnace is continuously used from the heat temperature at which dehydration or dehydrogenation of the oxide semiconductor layer is performed to the temperature which is enough to prevent reincorporation of water. Specifically, slow cooling is performed in a nitrogen atmosphere until the temperature becomes lower than the heating temperature by 100° C. or more. Without being limited to a nitrogen atmosphere, the dehydration or dehydrogenation may be performed in a rare gas atmosphere (such as helium, neon, or argon).

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

Note that in the first heat treatment, it is preferable that water, hydrogen, hydrocarbon and the like be not contained in nitrogen or a rare gas such as helium, neon, or argon in an atmosphere. Alternatively, it is preferable that nitrogen or a rare gas such as helium, neon, or argon introduced into a heat treatment apparatus have purity of 6N (99.9999%) or more, preferably, 7N (99.99999%) or more; that is, an impurity concentration is set to 1 ppm or lower, preferably, 0.1 ppm or lower.

Depending on conditions of the first heat treatment or a material of the oxide semiconductor layer, the oxide semiconductor layer may be crystallized to be a microcrystalline film or a polycrystalline film in some cases. In the case of a microcrystalline film, it is preferable that the proportion of a crystalline component to the whole film be 80% or more (more preferably, 90% or more) and filled so that adjacent microcrystalline grains are in contact with each other. Depending on conditions of the first heat treatment and the material of the oxide semiconductor layer, the entire oxide semiconductor layer is made to be in an amorphous state in some cases.

After the first heat treatment, the oxide semiconductor layers 6a and 6b become oxygen-deficient type so as to be low-resistance oxide semiconductor layers (see FIG. 1B). In other words, the carrier concentration of the oxide semiconductor layers after the first heat treatment is higher than that of the oxide semiconductor film just after the deposition; it is preferable that the oxide semiconductor layers 6a and 6b each have a carrier concentration of $1\times10^{18}/cm^3$ or more.

Depending on the conditions of the first heating treatment or a material of the gate electrode layers 3a and 3b, the gate electrode layers 3a and 3b may be crystallized to be microcrystalline films or polycrystalline films in some cases. For example, in the case where films of indium tin oxide are used as the gate electrode layers 3a and 3b, they are crystallized by the first heat treatment at 450° C. for one hour, whereas in the case where films of indium tin oxide containing silicon oxide are used as the gate electrode layers 3a and 3b, they are not crystallized.

Alternatively, the first heat treatment may be performed on the oxide semiconductor film before it is processed into the island-shaped oxide semiconductor layers. In that case, after the first heat treatment, the substrate is taken out of the heat treatment apparatus and subjected to a fifth photolithography step. As a result of the first heat treatment, the etching rate of the oxide semiconductor may be decreased.

Next, an oxide insulating film is formed over the gate insulating layer 4 and the oxide semiconductor layers 6a and 6b by a sputtering method. Then, a resist mask is formed by a sixth photolithography step, and the oxide insulating layers 7a and 7b are formed by selective etching. After that, the resist mask is removed (see FIG. 1C). At this stage, in the oxide semiconductor layers 6a and 6b, there are regions in contact with the oxide insulating layers 7a and 7b. Among these regions, the region which overlaps with the oxide insulating layer 7a and also overlaps with the gate electrode layer 2a with the gate insulating layer 4 interposed therebetween is the channel formation region 8a. In addition, the first region 11c and the second region 11d overlapping with the oxide insulating layer 7b which covers the peripheral portion and side surface of the oxide semiconductor layer is formed as well. By the sixth photolithography step, a contact hole reaching the gate electrode layer 2b and a contact hole reaching the drain electrode layer 5b are also formed.

The oxide insulating film can be formed to a thickness of at least 1 nm or more by a sputtering method, or the like, as appropriate, which is a method with which impurities such as water and hydrogen are not mixed into the oxide insulating film. In this embodiment, a silicon oxide film is formed by a sputtering method, as the oxide insulating film. The substrate temperature in film formation may be from room temperature to 300° C. inclusive and in this embodiment, is 100° C. The silicon oxide film can be deposited by a sputtering method in a rare gas (typically argon) atmosphere, an oxygen atmosphere, or an atmosphere including a rare gas (typically argon) and oxygen. Moreover, a silicon oxide target or a silicon target can be used as a target.

For example, with use of a silicon target, a silicon oxide film can be formed by a sputtering method in an atmosphere of oxygen and a rare gas. As the oxide insulating film formed in contact with the oxide semiconductor layers 6a and 6b whose resistance is reduced, an inorganic insulating film that does not include impurities such as moisture, a hydrogen ion, and OH⁻ and blocks entry of these from the outside may be used. Typically, a silicon oxide film, a silicon nitride oxide film, an aluminum oxide film, an aluminum oxynitride film, or the like is used.

In this embodiment, film deposition is performed by a pulsed DC sputtering method using a silicon target doped with columnar polycrystalline boron, which has a purity of 6N and a resistivity of 0.01 Ωcm, in which the distance between the substrate and the target (T-S distance) is 89 mm, the pressure is 0.4 Pa, the direct-current (DC) power source is 6 kW, and the atmosphere is oxygen (proportion of the oxygen flow is 100%). The film thickness thereof is 300 nm.

Next, second heat treatment is performed in an inert-gas atmosphere or a nitrogen atmosphere (preferably at a temperature from 200° C. to 400° C. inclusive, e.g., from 250° C. to 350° C. inclusive). For example, the second heat treatment is performed at 250° C. for one hour in a nitrogen atmosphere. In the second heat treatment, the end portion of the oxide semiconductor layer 6a overlapping with the oxide insulating layer 7b and part of the oxide semiconductor layer 6a overlapping with the oxide insulating layer 7a are heated while being in contact with the oxide insulating layers.

According to the second heat treatment, heat is applied while part of the oxide semiconductor layer which does not overlap with the oxide insulating layers is exposed. When heat treatment is performed in a nitrogen atmosphere or an inert gas atmosphere where the oxide semiconductor layer 6a is exposed, the resistance of the exposed part can be further reduced. Further, parts in contact with the oxide insulating layers 7a and 7b are supplied with oxygen (made to be in an oxygen-excess state) and can have higher resistance (become i-type oxide semiconductor layers). Note that the oxide insulating layer 7a is provided over and in contact with the channel formation region of the oxide semiconductor layer 6a and functions as a channel protective layer.

Note that the timing for performing the second heat treatment is not limited to the timing just after the sixth photolithography step as long as it is after the sixth photolithography step.

Figure 1D:
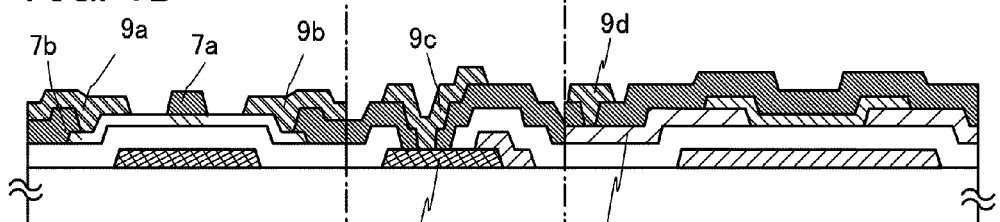
Figure 1E:
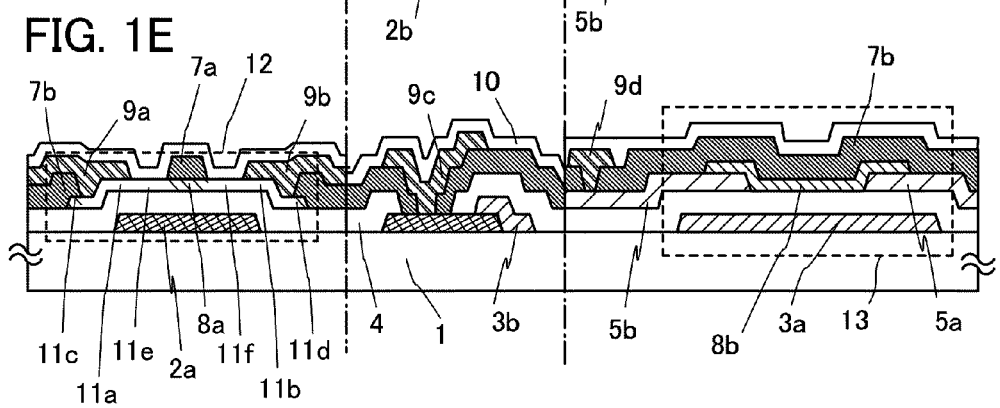

Next, a conductive film is formed over the gate insulating layer 4, the oxide insulating layers 7a and 7b, and the oxide semiconductor layer 6a, a resist mask is formed by a seventh photolithography step, and etching is selectively performed, so that the source electrode layer 9a and the drain electrode layer 9b are formed (see FIG. 1D).

In addition, as shown in FIG. 1D, a connection electrode layer 9c which is electrically connected to the gate electrode layer 2b and a connection electrode layer 9d which is electrically connected to the drain electrode layer 5b are formed. The conductive film is formed by a sputtering method, a vacuum evaporation method (e.g., an electron beam evaporation method, or the like), an arc discharge ion plating method, or a spray method.

As the material of the conductive film, an element selected from Al, Cr, Cu, Ta, Ti, Mo, and W, an alloy containing any of these elements as a component, an alloy containing these elements in combination, and the like can be used. The conductive film is not limited to a single layer containing the above-described element and may be two or more layers. In this embodiment, a three-layer conductive film in which a titanium film (with a thickness of 100 nm), an aluminum film (with a thickness of 200 nm), and a titanium film (with a thickness of 100 nm) are stacked is formed. Instead of a Ti film, a titanium nitride film may be used.

In the seventh photolithography step, only portions of the conductive film which are above and in contact with the oxide semiconductor layers are removed. Thus, when an ammonia peroxide mixture (for example, a mixture solution in which hydrogen peroxide: ammonia: water=5:2:2) or the like as an alkaline etchant is used in order to selectively remove only part of the conductive film, which is above and in contact with the oxide semiconductor layer, the metal conductive film can be selectively removed so that the oxide semiconductor layer containing an In—Ga—Zn—O-based oxide semiconductor can be left.

The resist mask for forming the source electrode layer 9a and the drain electrode layer 9b may be formed by an inkjet method. A photomask is not used when the resist mask is formed by an inkjet method, which results in reducing manufacturing cost.

Through the above steps, resistance of the oxide semiconductor layers 6a and 6b is reduced, and part of the region whose resistance is reduced is selectively made to be in an oxygen-excess state. As a result, the channel formation region 8a in contact with the oxide insulating layer 7a becomes i-type, the first region 11c and the second region 11d of the oxide semiconductor layer 6a, which are in contact with the oxide insulating layer 7b becomes i-type, and the high-resistance source region 11a which overlaps with the source electrode layer 9a and the high-resistance drain region 11b which overlaps with the drain electrode layer 9b are formed in a self-aligned manner.

Note that the areas in which the high-resistance source region 11a and the high-resistance drain region 11b are formed are different depending on the thickness of the oxide semiconductor layer. In the case where the thickness of the oxide semiconductor layer is 15 nm or less, for example, parts overlapping with the source electrode layer, the drain electrode layer, or the conductive layer entirely become n-type (n⁻-type) regions. In the case where the thickness of the oxide semiconductor layer is 30 nm to 50 nm, for example, in parts overlapping with the source electrode layer, the drain electrode layer, or the conductive layer, n-type regions are formed in the vicinity of the source electrode layer, the drain electrode layer, or the conductive layer, while i-type regions are formed under the n-type regions in some cases.

In addition, the high-resistance drain region 11b (or the high-resistance source region 11a) is formed, whereby reliability can be increased when a driver circuit is formed. Specifically, by forming the high-resistance drain region 11b, conductivity can vary gradually from the drain electrode layer to the channel formation region through the high-resistance drain region 11b. Therefore, in the case where the thin film transistor operates using the drain electrode layer connected to a wiring for supplying a high power supply potential VDD, the high-resistance drain region (or the high-resistance source region) serves as a buffer and a high electric field is not applied locally even if the high electric field is applied between the gate electrode layer and the drain electrode layer, so that the withstand voltage of the transistor can be improved.

Further, leakage current can be reduced in the channel formation region 8a when the driver circuit is formed, by forming the high-resistance drain region 11b (or the high-resistance source region 11a).

Next, the insulating layer 10 is formed over the oxide insulating layers 7a and 7b, the source electrode layer 9a, the drain electrode layer 9b, the connection electrode layer 9c, and the connection electrode layer 9d (see FIG. 1E). As the insulating layer 10, a silicon nitride film, a silicon nitride oxide film, an aluminum nitride film, or the like is used. In this embodiment, the insulating layer 10 is formed using a silicon nitride film by an RF sputtering method.

Through the above process, two kinds of thin film transistors, the channel protective thin film transistor 12 and the bottom-contact thin film transistor 13, can be manufactured over one substrate.

In the channel protective thin film transistor 12, the width of the oxide insulating layer 7a is narrowed so that the channel length L can be shortened to 0.1 µm to 2 µm inclusive, whereby a thin film transistor with high operation rate can be achieved. In the bottom-contact thin film transistor 13, the channel length is longer than that of the channel protective thin film transistor 12, whereby a thin film transistor with less off current is achieved. Further, the bottom-contact thin film transistor 13 is structured by materials having a light-transmitting property except for the connection electrode layer 9d.

In the case where an active matrix display device is manufactured, a plurality of thin film transistors are provided in one pixel in some cases. For example, another thin film transistor is provided in addition to a pixel selection thin film transistor, which electrically connects to the pixel selection thin film transistor and connects to the pixel electrode or a storage capacitor. Such a thin film transistor may have a channel length L of 55 µm and a channel width W of 20 µm, while the pixel selection thin film transistor may have a channel length L of 25 µm and a channel width W of 60 µm. The width where the source electrode layer overlaps with the gate electrode layer in the channel length direction is 5 µm, and the width where the drain electrode layer overlaps with the gate electrode layer in the channel length direction is 5 µm. A structure of the thin film transistor 13 which is a bottom-contact thin film transistor may be used for both of the thin film transistors.

In the case where a plurality of thin film transistors are provided in one pixel, a power source supply line electrically connected to the source electrode layer of the thin film transistor connected to the pixel is provided, which intersects with a gate wiring and may be formed using the same material and step as the connection electrode layer 9c which includes a metal conductive film. Alternatively, the power source supply line intersects with a source wiring and may be formed using the same material and step as the gate electrode layer 2b.

Further, in the case where a driver circuit is formed over the same substrate, for example, the channel protective thin film transistor 12 may be used, in which the channel length L is 2 µm and the channel width W is 50 µm. The widths of a third region 11e and a fourth region 11f in the channel length direction each may be 2 µm. The width where the source electrode layer overlaps with the gate electrode layer in the channel length direction may be 2 µm, and the width where the drain electrode layer overlaps with the gate electrode layer in the channel length direction may be 2 µm.

A plurality of kinds of circuits, a driver circuit and a pixel portion in this embodiment, are formed over one substrate, and either of the channel protective thin film transistor 12 or the bottom-contact thin film transistor 13 is used in accordance with respective characteristics of the driver circuit and the pixel portion, thereby achieving optimization.

Through the above steps, an active matrix circuit is completed. Hereinafter, a manufacturing method of a liquid crystal display device using the active matrix circuit is described with reference to FIGS. 2A and 2B.

Figure 2A:
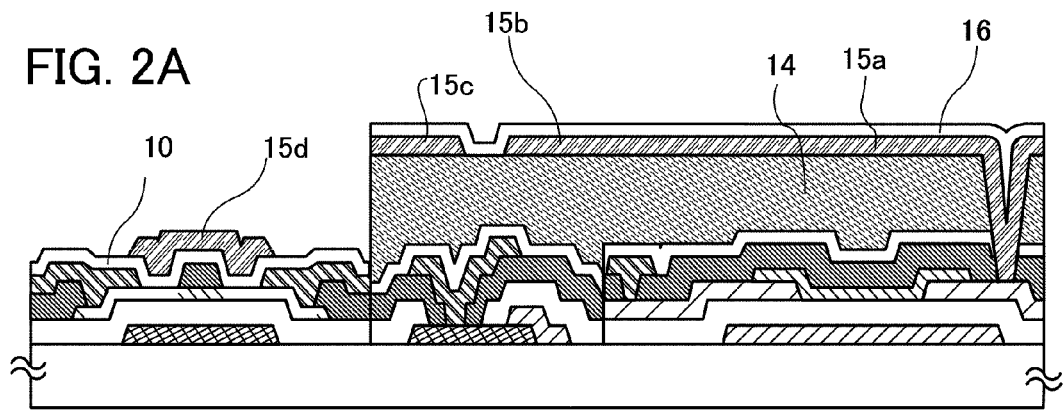
FIGS. 2A and 2B are cross-sectional process views illustrating one embodiment of the present invention.

First, a planarizing insulating layer 14 is formed over the insulating layer 10 of a silicon nitride film formed over the substrate manufactured to a state of FIG. 1E. The planarizing insulating layer 14 is provided to make the thickness of a liquid crystal layer uniform so as to perform liquid crystal display uniformly, and is not required to be provided in the driver circuit. In this embodiment, a planarizing insulating layer is not provided in a driver circuit portion, as illustrated in FIG. 2A.

However, in the case of forming a planarizing insulating layer over the entire surface of the substrate using a spin coating method, the planarizing insulating layer in the driver circuit portion is required to be etched later by patterning using a method such as a photolithography method. Therefore, in such a case, the planarizing insulating layer in the driver circuit portion may be left in order to simplify the process.

On the other hand, although high accuracy is not required in patterning of the planarizing insulating layer, a light-transmitting conductive material formed later can be used as a back gate of the thin film transistor in the driver circuit portion, if insufficient patterning does not cause a reduction in yield in terms of a process.

In one embodiment of the present invention, although part of the thin film transistor or the wiring in the pixel region is formed of material having a light-transmitting property, in order to enjoy the benefits at most, the area of a pixel electrode layer formed later is preferred to be made as large as possible. In other words, the pixel electrode layer is provided over the thin film transistor and the wiring.

However, in such a structure, parasitic capacitance between the thin film transistor and the pixel electrode layer or between the wiring and the pixel electrode layer becomes a problem. Therefore, selection of material and thickness of the planarizing insulating layer must be paid attention to. In other words, it is preferable that the planarizing insulating layer be as thick as possible and the relative dielectric constant thereof be small as possible.

As a material for forming the planarizing insulating layer, for example, an organic material having heat resistance, such as an acrylic resin, polyimide, a benzocyclobutene resin, polyamide, or an epoxy resin can be used. Other than such organic materials, it is also possible to use a low-dielectric constant material (a low-k material), a siloxane-based resin, PSG (phosphosilicate glass), BPSG (borophosphosilicate glass), or the like. The planarizing insulating layer may be formed by stacking a plurality of insulating films formed of these materials.

Note that the siloxane resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the planarizing insulating layer 14. The planarizing insulating layer 14 can be formed, depending on the material, by a deposition method such as a sputtering method, an SOG method, a spin coating method, a dipping method, a spray coating method, or a droplet discharge method (e.g., an inkjet method, screen printing, or offset printing), or a tool such as a doctor knife, a roll coater, a curtain coater, or a knife coater.

The thickness of the planarizing insulating layer 14 is preferably 500 nm to 20 μm, inclusive. In this embodiment, photosensitive acrylic is used to form the planarizing insulating layer 14 with a thickness of 5 μm. An eighth photolithography step is performed, and a contact hole reaching the source electrode layer 5a is formed by etching the planarizing insulating layer 14, the oxide insulating layer 7b and the insulating layer 10.

Next, a conductive film having a light-transmitting property is formed, a ninth photolithography step is performed to form a resist mask, unnecessary part is removed by etching, and a pixel electrode layer 15a, another pixel electrode layer 15b, and a pixel electrode layer 15c of a pixel adjacent to the pixel including the pixel electrode layer 15b are formed over the planarizing insulating layer 14. Further, a conductive layer 15d is formed over the insulating layer 10, which is to be a back gate of the thin film transistor in the driver circuit portion. As illustrated in FIG. 2A, the pixel electrode layers 15b and 15c are made to be separated over the gate electrode layer 2b which is a metal wiring. Thus, light entering the display portion can be utilized for display, being blocked as little as possible.

By providing the conductive layer 15d to overlap with the channel formation region 8a of the oxide semiconductor layer, reliability of the thin film transistor can be improved. In general, a bias-temperature stress test (hereinafter, referred to as a BT test) is performed to examine reliability of thin film transistors. A thin film transistor of which shift in the threshold voltage between before and after the BT test is small has higher reliability. By using a thin film transistor having the above structure, compared to other thin film transistors, the amount of shift in the threshold voltage of the thin film transistor before and after the BT test can be reduced. Note that the potential of the conductive layer 15d may be the same as or different from that of the gate electrode layer 2a. The conductive layer 15d can function as a second gate electrode layer.

For example, the potential of the conductive layer 15d may be GND or 0 V, or the conductive layer 15d may be in a floating state. Further, in the case where the threshold voltages of the thin film transistors are different between substrates or in one substrate, the threshold voltages can be adjusted by controlling the potential of this conductive layer 15d.

After that, a protective layer 16 which functions as an alignment film is formed using polyimide. Thus, a substrate on the active matrix side of a display device is completed. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode provided on the counter substrate is provided over the active matrix substrate, and a terminal electrically connected to the common electrode is provided. This terminal is provided so that the common electrode is fixed to a predetermined potential such as GND or 0 V.

Hereinafter, a method for manufacturing a counter substrate 30 is described. A color filter layer 18 is formed on a glass substrate 17. Although color filters are colored according to respective pixels, here, the color filters are shown as one color filter layer. As the glass substrate 17, a substrate may be selected from any of the above-described substrates which are appropriate to be used for the substrate 1 which is an active matrix substrate. Further, a counter electrode 19 is formed with a light-transmitting conductive material, and a protective film 20 functioning as an alignment film is formed using polyimide.

In this manner, the counter substrate 30 is obtained. Then, rubbing treatment is performed on each surface of the protective layer 16 of the active matrix substrate and the protective film 20 of the counter substrate 30 so that liquid crystal is aligned. Then, the substrates are attached to each other with a liquid crystal layer 21 including a liquid crystal material interposed therebetween.

In the attachment, the substrate 1 and the counter substrate 30 are attached to each other with a spacer (not illustrated) which adjusts a cell gap of the liquid crystal display device and the liquid crystal layer 21 interposed therebetween, with use of a sealant (not illustrated). This attachment step may be performed under reduced pressure.

As the sealant, it is preferable to use visible light curable, ultraviolet curable, or heat curable resin typically. Specifically, an acrylic resin, an epoxy resin, an amine resin, or the like can be used. Further, a photopolymerization initiator (typically, an ultraviolet light polymerization initiator), a thermosetting agent, a filler, or a coupling agent may be included in the sealant.

The liquid crystal layer 21 is formed by filling a space with a liquid crystal material. As a method for forming the liquid crystal layer 21, a dispenser method (a dripping method) in which a liquid crystal is dripped before the attachment of the substrate 1 to the counter substrate 30 may be used, or an injection method in which a liquid crystal is injected by using a capillary phenomenon after the attachment of the substrate 1 to the counter substrate 30 can be used.

There is no particular limitation on the kind of liquid crystal material, and a variety of materials can be used. If a material exhibiting a blue phase is used as the liquid crystal material, an alignment treatment does not need to be performed.

Figure 2B:
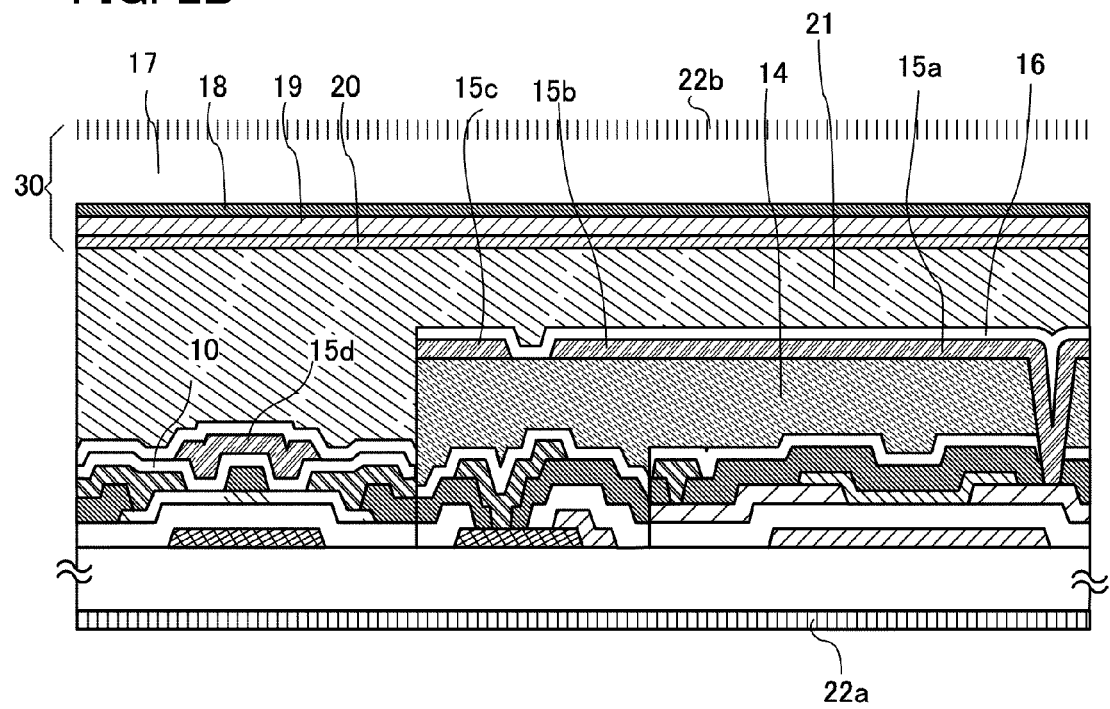

A transmissive liquid crystal display device in this embodiment can be manufactured by providing a polarizing plate 22a on the outer side of the substrate 1 and providing a polarizing plate 22b on the outer side of the counter substrate 30 (see FIG. 2B).

Although not illustrated in this embodiment, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In an active matrix liquid crystal display device, pixel electrodes arranged in a matrix form are driven to form a display pattern on a screen. Voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Further, there is another driving technique which is so-called double-frame rate driving. In the double-frame rate driving, a vertical synchronizing frequency is set 1.5 times or more, preferably, 2 times or more as high as a usual vertical synchronizing frequency, whereby the response speed is increased, and the grayscale to be written is selected for every plural fields which have been divided in each frame.

Furthermore, as a technique for improving moving image characteristics of a liquid crystal display device, there is another driving technique in which, as a backlight, a surface light source including a plurality of LED (light-emitting diode) light sources or a plurality of EL light sources is used, and each light source included in the surface light source is independently driven so as to perform intermittent lighting in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

In addition, the thin film transistor described in this embodiment can be applied to electronic paper. The electronic paper is also called an electrophoretic display device (electrophoretic display) and has advantages in that it has the same level of readability as regular paper, it has less power consumption than other display devices, and it can be set to have a thin and light form.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance that has a high dielectric constant moves to a high-electric field region.

A solution in which the microcapsules are dispersed in a solvent is called electronic ink, and this electronic ink can be printed on a surface of glass, plastic, fabric, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. As the active matrix substrate, for example, the active matrix substrate including the thin film transistor circuit described in this embodiment can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 17:
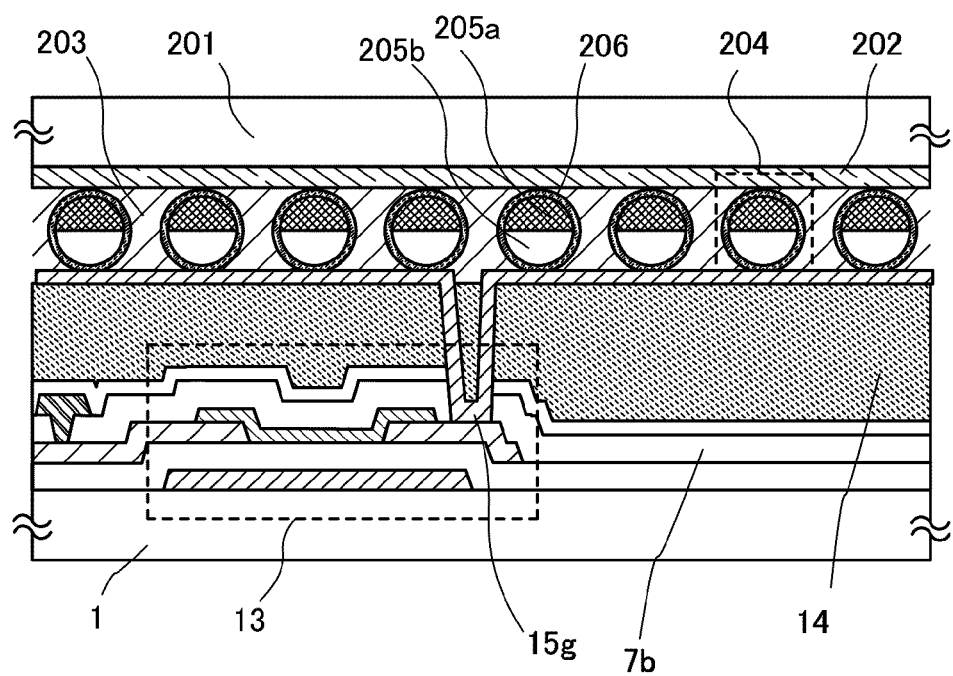
FIG. 17 illustrates an active matrix liquid crystal display device.

FIG. 17 illustrates an active matrix electronic paper using the thin film transistor in this embodiment. The thin film transistor 13 used in a semiconductor device is a highly reliable thin film transistor including an oxide semiconductor layer, which can be manufactured in a way similar to the thin film transistor described in this embodiment. In addition, thin film transistors described in other embodiments can be used. Note that in FIG. 17, same portions as those in FIGS. 1A to 1E or FIGS. 2A and 2B are denoted by the same reference numerals, unless otherwise specified.

The electronic paper in FIG. 17 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 13 is a bottom-gate thin film transistor and is covered with an oxide insulating layer 7b which is in contact with a semiconductor layer. The source or drain electrode layer of the thin film transistor 13 is in contact with and electrically connected to a pixel electrode layer 15g of the active matrix substrate in an opening formed in the planarizing insulating layer 14. Spherical particles 204 each having a black region 205a, a white region 205b, and a cavity 206 filled with liquid around the black region 205a and the white region 205b are provided between the pixel electrode layer 15g of the active matrix substrate and an electrode layer 202 on the counter substrate 201. A space around the spherical particles 204 is filled with a filler 203 such as a resin. The electrode layer 202 on the substrate 201 is electrically connected to a common potential line formed over the same substrate as the thin film transistor 13. A common connection portion is used, whereby the second electrode layer 202 and the common potential line can be electrically connected to each other through conductive particles arranged between a pair of substrates.

Further, instead of the twisting ball, an electrophoretic element can also be used. A microcapsule having a diameter of about 10 µm to 200 µm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. Furthermore, an image which is displayed once can be retained even when power is not supplied to the display portion.

Through the above steps, a highly reliable electronic paper as a semiconductor device can be manufactured.

As described above, manufacturing a variety of liquid crystal display devices with a thin film transistor for which an oxide semiconductor is used leads to reduction in manufacturing cost. In particular, an oxide insulating film is formed in contact with an oxide semiconductor layer using the above method, whereby a thin film transistor having stable electric characteristics can be manufactured and provided. Therefore, a semiconductor device which includes highly reliable thin film transistors having favorable electric characteristics can be provided.

In particular, the channel formation region in the semiconductor layer of the thin film transistor 13 is a high-resistance region; thus, electric characteristics of the thin film transistor are stabilized and increase in off current can be prevented. Therefore, a semiconductor device including a highly reliable thin film transistor having favorable electric characteristics can be provided.

Since a thin film transistor is easily broken due to static electricity or the like, a protective circuit is preferably provided over the same substrate as the pixel portion or the driver circuit. The protective circuit is preferably formed with a non-linear element including an oxide semiconductor layer.

For example, protective circuits are provided between the pixel portion and a scan line input terminal and between the pixel portion and a signal line input terminal In this embodiment, a plurality of protective circuits are provided so that the pixel transistor and the like are not broken when surge voltage due to static electricity or the like is applied to the scan line, the signal line, or a capacitor bus line.

Therefore, the protective circuit is formed so as to release charge to a common wiring when a surge voltage is applied. Further, the protective circuit includes non-linear elements arranged in parallel to the scan line. The non-linear element includes a two-terminal element such as a diode or a three-terminal element such as a transistor. For example, the non-linear element can also be formed through the same steps as those of the thin film transistor 13 in the pixel portion, and can be made to have the same properties as a diode by connecting a gate terminal to a drain terminal of the non-linear element.

This embodiment can be implemented in appropriate combination with the structures described in the other embodiments.

Embodiment 2

In this embodiment, described is the case where a transparent storage capacitor is formed in an active matrix liquid crystal display device, utilizing a wiring layer used in the thin film transistor of the present invention.

Figure 3:
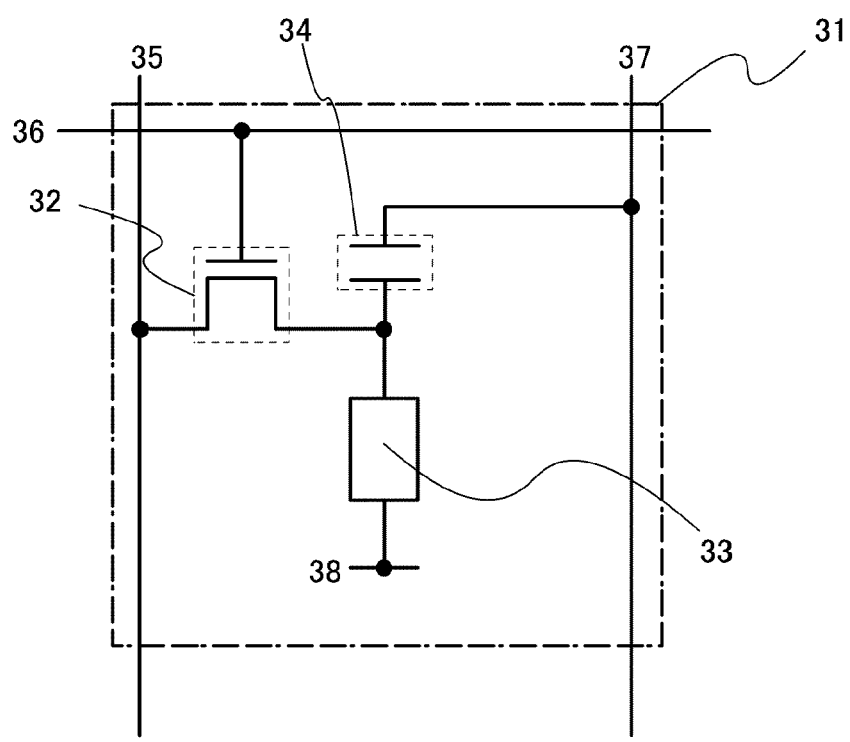
FIG. 3 is a circuit diagram of one pixel of a conventional active matrix liquid crystal display device.

FIG. 3 is a circuit diagram of a pixel 31 in a general active matrix liquid crystal display device. Here, a wiring 36 is a wiring which is called a gate line, a row line, or a scan line and is utilized for switching a selection transistor 32 in the pixel. A wiring 35 is a wiring which is called a source line, a column line, or a data line and is utilized for transmitting data to the pixel.

The transistor 32 in the pixel is turned on when a signal is transmitted to the wiring 36, and is turned off without transmitting a signal. While the transistor 32 is in an on state, current flows through a source and a drain of the transistor 32, whereas while in an off state, the current flow is blocked. With use of this characteristic, when a signal is transmitted to the wiring 35 while the transistor 32 is in an on state, the signal passes through the transistor 32 and is stored in a liquid crystal element 33. The liquid crystal element 33 is a kind of capacitor, and transmittance varies depending on the voltage generated by electric charges stored between a counter substrate 38 and the liquid crystal element 33. When the transistor 32 is turned off in the above condition, the voltage of the liquid crystal element 33 is kept almost constant.

It is preferable that the electric charges stored in the liquid crystal element be kept constant when the transistor 32 is in an off state; however, due to leakage current caused by a liquid crystal material or the transistor, the electric charges decrease over time actually. This decrease in electric charges causes flicker of display or the like. Therefore, in an actual active matrix liquid crystal display device, a storage capacitor 34 is provided so as to reduce an adverse effect due to decrease in electric charges as much as possible.

The storage capacitor 34 is a capacitor, in which one of terminals is designed to be connected to a capacitor line 37 so as to be held at a constant potential. Although FIG. 3 illustrates the capacitor line 37 which is arranged in parallel to the wiring 35, the capacitor line 37 may be arranged in parallel to the wiring 36 or may use a gate line of a pixel in another column.

Conventionally, a metal material is used for the storage capacitor 34, which causes reduction in the aperture ratio. Meanwhile, although there is a case where the storage capacitor is attempted to be formed using a light-transmitting conductive material, steps of stacking layers, photolithography, and etching are additionally needed in the conventional active matrix liquid crystal device in order to form two or more light-transmitting conductive layers, which causes reduction in productivity.

On the other hand, in one embodiment of the present invention, light-transmitting conductive materials are used for at least two layers other than the pixel electrode layer. Thus, with use of such light-transmitting conductive materials for forming a storage capacitor, a light-transmitting storage capacitor can be obtained without an additional step. Hereinafter, manufacturing steps of an active matrix liquid crystal display device including a light-transmitting storage capacitor are described with reference to FIGS. 4A to 4E. The manufacturing method is almost the same as that in Embodiment 1 except for formation of a storage capacitor; thus, detailed description of materials, treatment methods, and the like are omitted. In addition, the same portions as those in FIGS. 1A to 1E are denoted by the same reference numerals. For such portions, Embodiment 1 can be referred to. Moreover, formation processes of some wirings, a contact hole, and the like are not illustrated through FIGS. 4A to 4E; however, they can be assumed to be formed in a manner similar to that in Embodiment 1 and FIGS. 1A to 1E.

First, in a manner similar to that in Embodiment 1, a metallic conductive film is formed over the substrate 1 having an insulating surface, and then the gate electrode layer 2a of the thin film transistor for the active matrix driver circuit is formed by a first photolithography step.

Next, a light-transmitting conductive film is formed to cover the gate electrode layer 2a, and then a gate electrode layer 3d of the thin film transistor for the active matrix pixel and an electrode layer 3c that is to be one of electrodes of a storage capacitor are formed by a second photolithography step.

Next, the gate insulating layer 4 is formed over the gate electrode layers 2a and 3d and the electrode layer 3c. The light-transmitting conductive film is formed over the gate insulating layer 4, and then by performance of a third photolithography step, a source electrode layer 5d and a drain electrode layer 5e of the pixel thin film transistor and an electrode layer 5c that is to be the other electrode of the storage capacitor are formed (see FIG. 4A).

Through the above steps, a capacitor including the electrode layer 3c and the electrode layer 5c is formed. A dielectric of this capacitor is the gate insulating layer 4 used as a gate insulator of the thin film transistors. A preferable gate insulator of a thin film transistor has, in general, high dielectric constant and small thickness, which almost corresponds to the purpose of the dielectric of the storage capacitor. Needless to say, it is preferable that the storage capacitor have leakage current as little as possible; thus, the gate insulator needs to have the thickness and a material suitable for the purpose of the storage capacitor.

Next, by performance of a fourth photolithography step, the gate insulating layer 4 is selectively etched so that a contact hole, like the contact hole reaching the gate electrode layer 2b as illustrated in FIG. 1B, is formed. However, this step is not illustrated in any of FIGS. 4A to 4E.

Next, over the gate insulating layer 4, an oxide semiconductor film is formed to a thickness from 5 nm to 200 nm inclusive, preferably from 10 nm to 20 nm inclusive. In the case where the thickness of the oxide semiconductor film is 50 nm or smaller, the oxide semiconductor film can keep an amorphous structure even if heat treatment for dehydration or dehydrogenation is performed later.

Figure 4A:
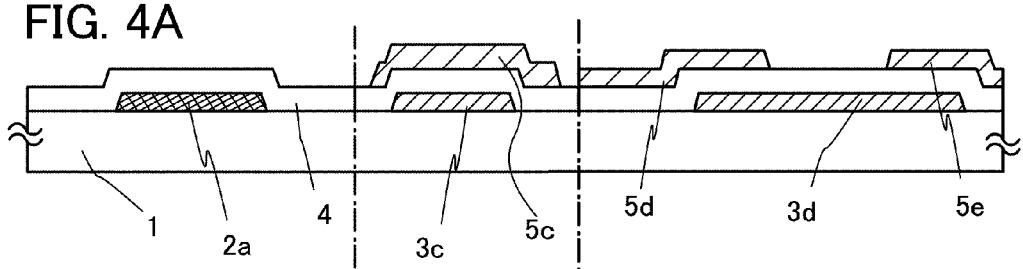
FIGS. 4A to 4E are cross-sectional process views illustrating one embodiment of the present invention.
Figure 4B:
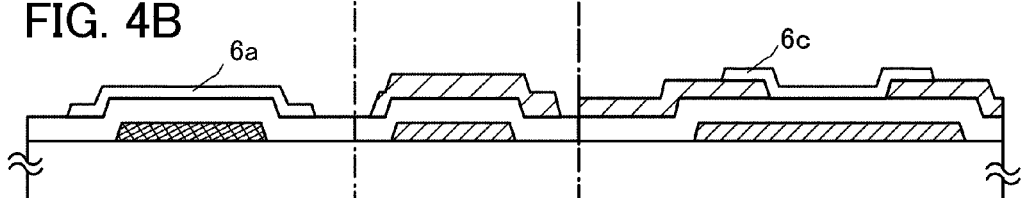
Figure 4C:
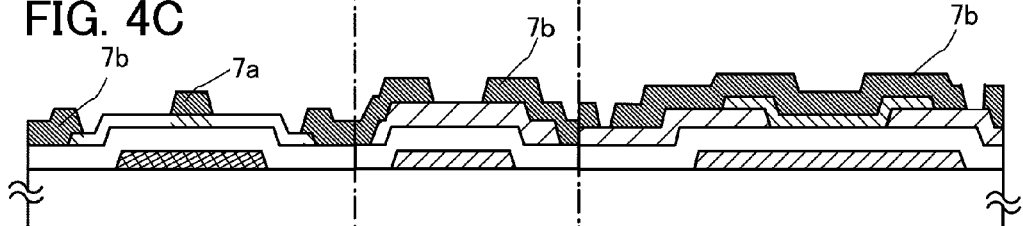

Next, as illustrated in FIG. 4B, the oxide semiconductor film is processed into the island-shaped oxide semiconductor layer 6a and an island-shaped oxide semiconductor layer 6c by performance of a fifth photolithography step. Etching of the oxide semiconductor film may be either wet etching or dry etching. Then, dehydration or dehydrogenation of the oxide semiconductor layer, as described in Embodiment 1, is performed.

Next, an oxide insulating film is formed by a sputtering method over the gate insulating layer 4, the oxide semiconductor layers 6a and 6c, the source and drain electrode layers 5d and 5e, and the electrode layer 5c which is to be the other electrode of the storage capacitor. After that, by performance of a sixth photolithography step, a resist mask is formed, and selective etching is performed, so that the oxide insulating layers 7a and 7b are formed, and then, the resist mask is removed (see FIG. 4C).

Figure 4D:
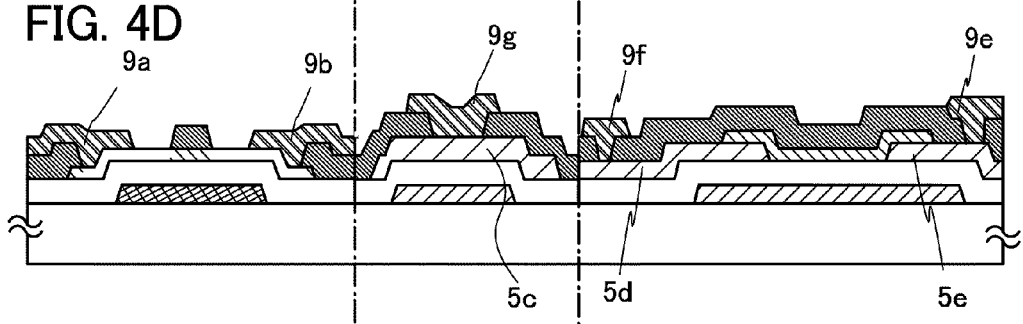

Next, a metallic conductive film is formed over the gate insulating layer 4, the oxide insulating layers 7a and 7b, and the oxide semiconductor layers. Then, by performance of a seventh photolithography step, a resist mask is formed, and selective etching is performed, so that the source electrode layer 9a and the drain electrode layer 9b are formed (see FIG. 4D). Besides, as illustrated in FIG. 4D, a connection electrode layer 9g which is electrically connected to the electrode layer 5c, a connection electrode layer 9f which is electrically connected to the source electrode layer 5d of the pixel thin film transistor, and a connection electrode layer 9e which is electrically connected to the drain electrode layer 5e of the pixel thin film transistor are formed.

Figure 4E:
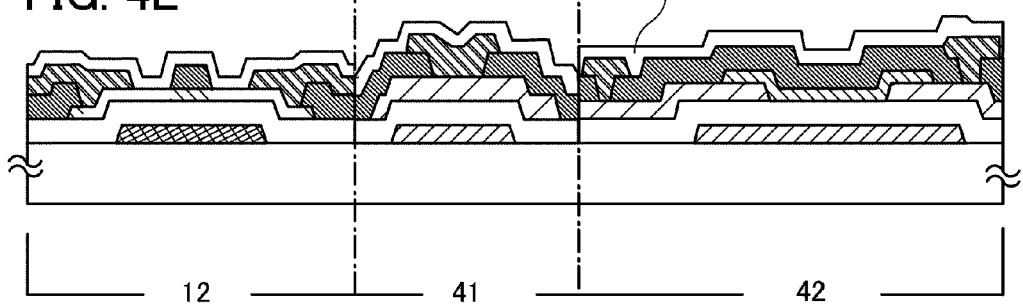

Next, the insulating layer 10 is formed over the oxide insulating layers 7a and 7b, the source electrode layer 9a, the drain electrode layer 9b, and the connection electrode layers 9e, 9f, and 9g (see FIG. 4E).

Through the above steps, over the one substrate, the channel-protective thin film transistor 12 for the driver circuit, a bottom-contact thin film transistor 42 for the pixel, and a storage capacitor 41 for the pixel can be manufactured.

Provision of the connection electrode layer 9e, in the above-described steps, which is connected to the drain electrode layer of the pixel thin film transistor is different from the structure of the thin film transistor illustrated in FIGS. 1A to 1E. However, this difference does not make an increase in the number of steps. The connection electrode layer 9e is provided for connection with the storage capacitor in this embodiment. Detailed description is made below.

In FIG. 4E, although the connection electrode layer 9g is illustrated to occupy a large area in the storage capacitor 41, the portion which needs the connection electrode layer 9g is just a limited area. Thus, most part of the storage capacitor can be formed using a light-transmitting material.

In the storage capacitor manufactured in this embodiment, the electrode layer 3c which is one of electrodes of the capacitor is formed from the layer from which the gate electrode layer 3d of the pixel thin film transistor is formed, and the connection electrode layer 9g electrically connected to the electrode layer 5c which is the other electrode of the capacitor is formed from the layer from which the connection electrode layer 9e which is connected to the drain of the pixel thin film transistor is formed. As is apparent from FIGS. 1A to 1E, the gate electrode layer 3b (which is formed from the same layer as the gate electrode layer 3d in FIGS. 4A to 4E) is connected to the gate electrode layer 2b (the gate wiring layer) of a metal material. Accordingly, for example, the gate electrode layer 3d may be connected to a wiring layer which is formed from the same layer as the gate electrode layer 2b (gate wiring layer) in FIGS. 1A to 1E, so that the capacitor line 37 of FIG. 3 is formed. In this case, the capacitor line may be provided so as to be in parallel to the wiring 36, which is different from the configuration of FIG. 3. Note that in this case, the connection electrode layer 9e which is connected to the drain electrode layer of the pixel thin film transistor is not necessarily provided.

The connection electrode layer 9g connected to the electrode layer 5c is formed from the same layer as the connection electrode layer 9f connected to the source of the pixel thin film transistor. The connection electrode layer 9f is to be the wiring 35 illustrated in FIG. 3; thus, the connection electrode layer 9g can be provided in parallel to the wiring 35, which is similar to the capacitor line 37. In this case, the electrode layer 5c which is the other electrode of the capacitor is needed to be connected to the drain electrode layer 5e of the thin film transistor. It is apparent that the connection between the electrode layer 3c and the drain electrode layer 5e is easily achieved, from that the wiring which is formed from the same layer as the connection electrode layer 9e and illustrated as the connection electrode layer 9c in FIGS. 1D and 1E is connected to the gate electrode layer 3b formed from the same layer as the electrode layer 3c through the metallic gate electrode layer 2b.

Figure 6:
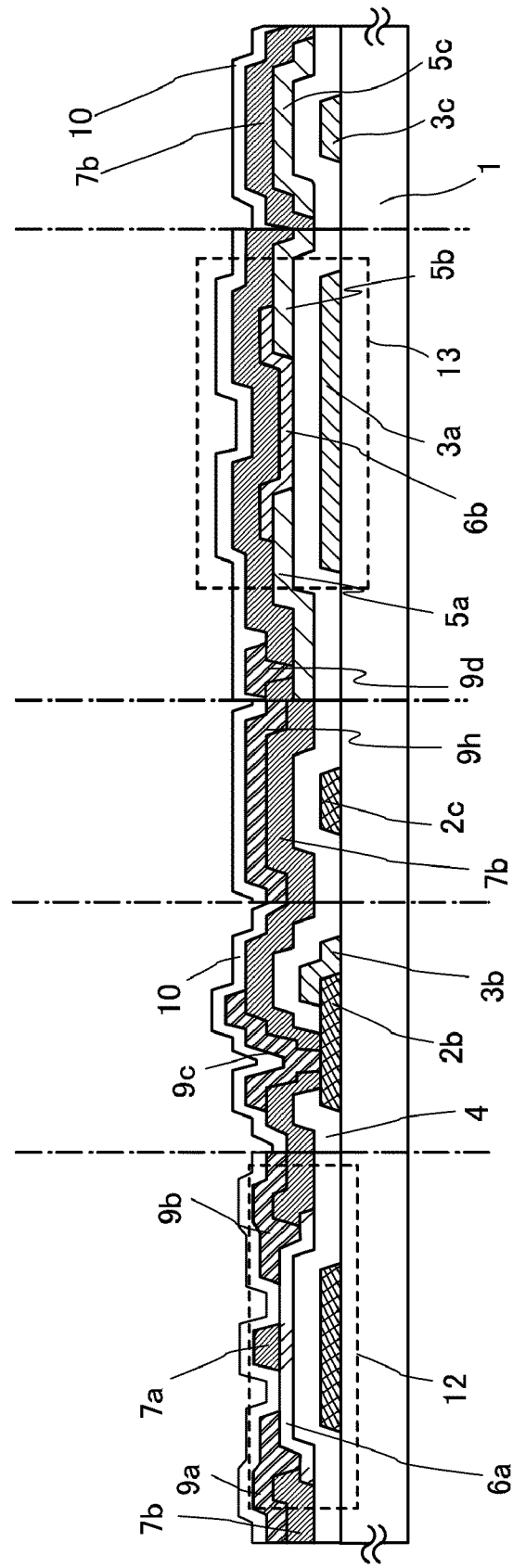
FIG. 6 is a cross-sectional view illustrating one embodiment of the present invention.

Further described is the active matrix liquid crystal display device including the above storage capacitor. Here, a wiring intersection and a capacitor portion (storage capacitor) are also illustrated. FIG. 6 is a cross-sectional view illustrating a substrate which is in a state before the planarizing insulating layer is formed in Embodiment 1. The same portions as those in FIGS. 1A to 1E and FIGS. 2A and 2B are denoted by the same reference numerals.

In FIG. 6, a pixel thin film transistor is the bottom-contact thin film transistor 13. As illustrated in FIG. 6, in the pixel portion, the storage capacitor is formed with use of the electrode layer 3c and the electrode layer 5c. The storage capacitor in FIG. 6 includes the gate insulating layer 4 as a dielectric.

Moreover, as illustrated in FIG. 6, the wiring intersection has a structure in which the gate insulating layer 4 and the oxide insulating layer 7b are stacked between a gate wiring layer 2c and a source wiring layer 9h in order to reduce parasitic capacitance. Note that although FIG. 6 exemplifies that the gate wiring layer 2c is a metal conductive film, the gate wiring layer 2c can be formed using the light-transmitting conductive film from which the gate electrode layer 3a of the thin film transistor 13 is formed in the case where the wiring resistance does not cause any problem or in the case where a material with sufficiently reduced sheet resistance (e.g., silver nanowire) is used.

Figure 14:
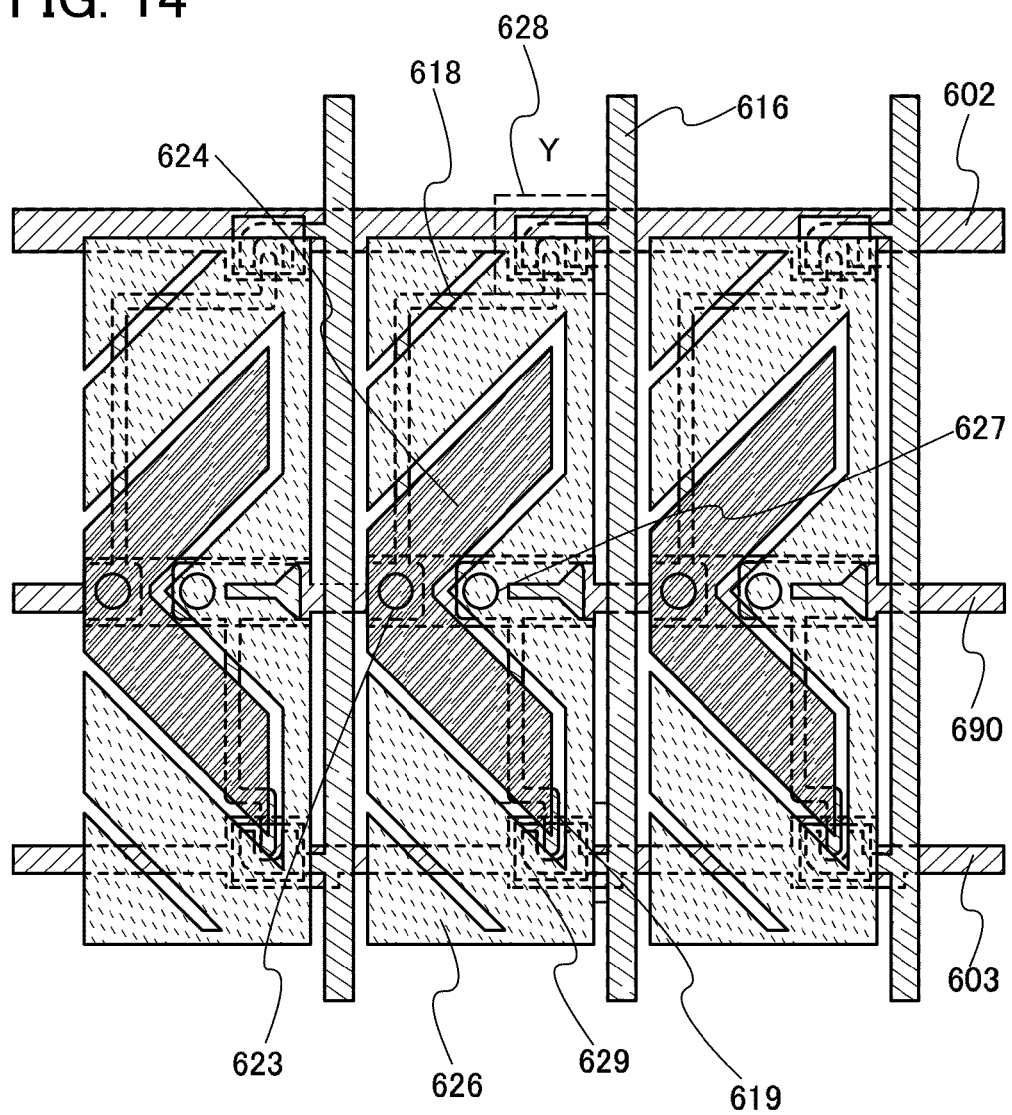
FIG. 14 illustrates an active matrix liquid crystal display device.
Figure 15:
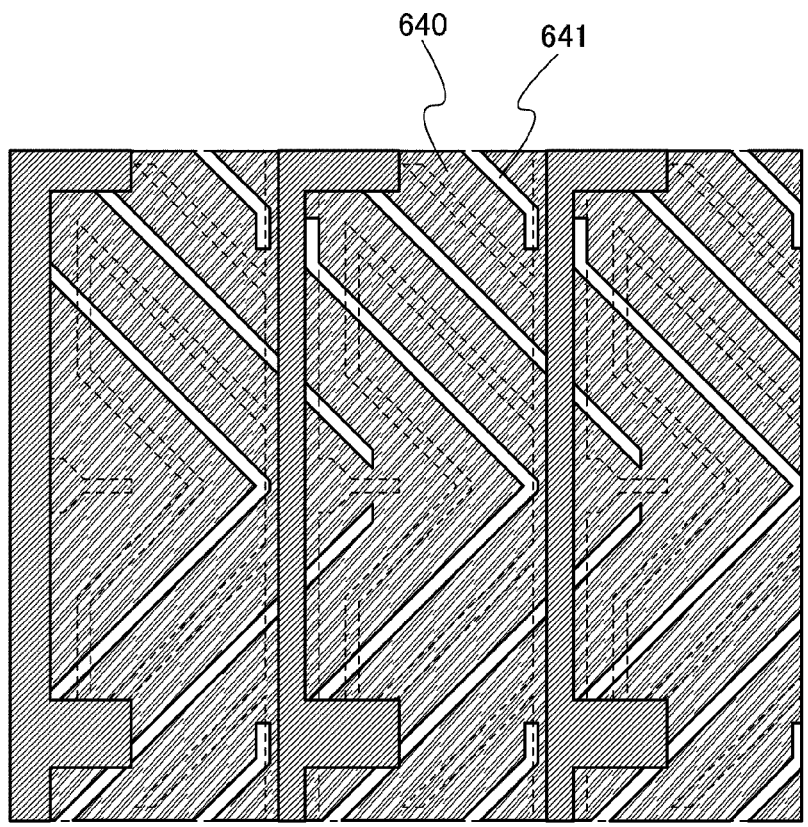
FIG. 15 illustrates an active matrix liquid crystal display device.
Figure 16:
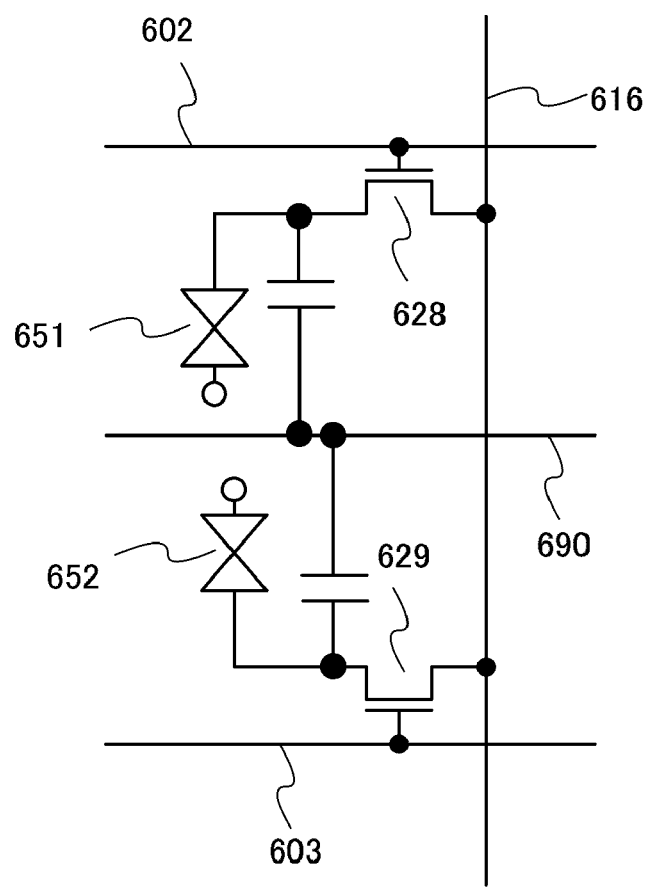
FIG. 16 shows an active matrix liquid crystal display device.

Next, described is a VA (vertical alignment)-type liquid crystal display device including the above thin film transistor, which is different from that of Embodiment 1, with reference to FIG. 14, FIG. 15, and FIG. 16.

FIG. 14 shows a pixel structure of a VA-type liquid crystal display panel. FIG. 15 shows a structure of a counter electrode. FIG. 16 is a circuit diagram of one pixel. Hereinafter, description is made with reference to these drawings.

In this pixel structure, a plurality of pixel electrodes are included in one pixel, and a thin film transistor is connected to each of the pixel electrodes. Each thin film transistor is driven by a different gate signal. That is, signals that are applied to individual pixel electrodes in a multi-domain pixel are controlled independently of each other.

Both thin film transistors 628 and 629 are connected to a wiring 690 and a wiring 616. A pixel electrode 624 is connected to the thin film transistor 628 through a wiring 618 in a contact hole 623. In a contact hole 627, a pixel electrode 626 is connected to the thin film transistor 629 through a wiring 619. A gate wiring 602 of the thin film transistor 628 and a gate wiring 603 of the thin film transistor 629 are separated so that different gate signals can be given thereto. On the other hand, the wiring 616 functioning as a data line is used in common for the thin film transistors 628 and 629. Further, a wiring for the storage capacitor described in this embodiment may be provided in parallel to the pixel electrodes. To the thin film transistors 628 and 629, any of transistors described in the other embodiments may be used as appropriate besides the thin film transistor described in this embodiment.

The pixel electrodes 624 and 626 have different shapes and are separated by a slit. The pixel electrode 626 surrounds the pixel electrode 624, which has a V-shape. Timing of voltage application is made to vary between the pixel electrodes 624 and 626 by the thin film transistors 628 and 629 in order to control orientation of the liquid crystal. FIG. 16 illustrates an equivalent circuit of this pixel structure. The thin film transistor 628 is connected to the gate wiring 602, and the thin film transistor 629 is connected to the gate wiring 603. When different gate signals are supplied to the gate wirings 602 and 603, operation timings of the thin film transistors 628 and 629 can vary.

FIG. 15 illustrates a structure of the counter substrate side. The counter substrate is provided with a color filter layer and a counter electrode layer as described and illustrated in Embodiment 1 and FIG. 2B. Note that a planarization film is preferably formed between the color filter layer and the counter electrode in order to prevent alignment disorder of liquid crystal. A slit 641 is formed in a counter electrode 640 which is used in common between different pixels in FIG. 15. The slit 641 and the slit on the side of the pixel electrodes 624 and 626 are alternately arranged in an engaging manner; thus, an oblique electric field is effectively generated, and the alignment of liquid crystals can be controlled. Accordingly, a direction in which the liquid crystal is aligned can vary depending on location, and a viewing angle can be increased.

A first liquid crystal element 651 is formed by overlapping the pixel electrode 624, a liquid crystal layer, and the counter electrode 640. In addition, a liquid crystal element 652 is formed by overlapping the second pixel electrode 626, the liquid crystal layer, and the counter electrode 640. This is a multi-domain structure in which the first liquid crystal element 651 and the second liquid crystal element 652 are included in one pixel.

Embodiment 3

Figure 7A:
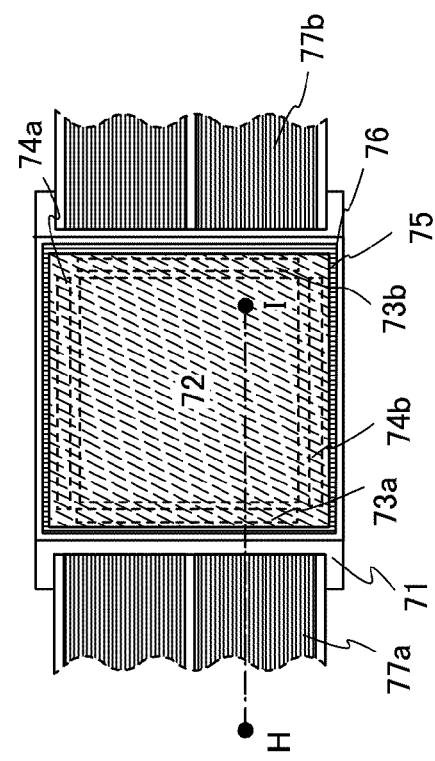
FIGS. 7A and 7B are a plan view and a cross-sectional view, respectively, illustrating one embodiment of the present invention.
Figure 7B:
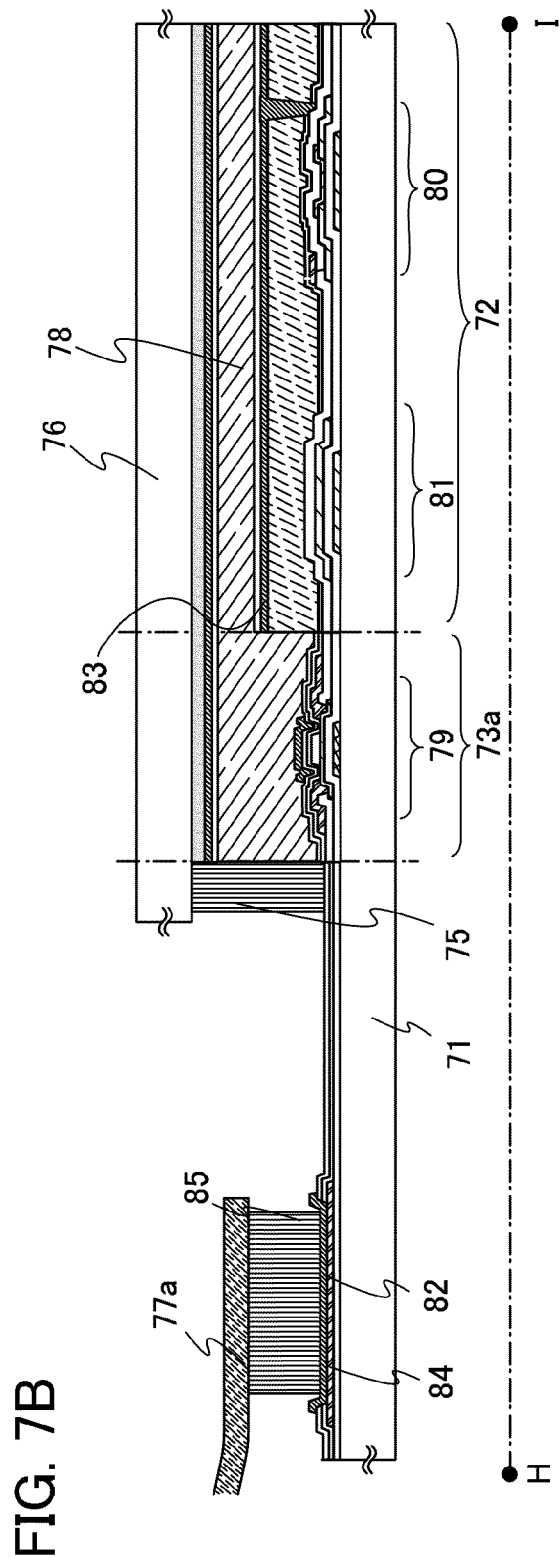

In this embodiment, an external view and a cross section of an active matrix liquid crystal display panel will be described in FIGS. 7A and 7B. FIG. 7A is a plan view of a panel in which liquid crystal is sealed between a first substrate provided with an active matrix circuit including the thin film transistor and a second substrate (counter substrate) with a sealant. FIG. 7B is a cross-sectional view taken along line H-I of FIG. 7A, which includes the structure illustrated in FIG. 2B.

A sealant 75 is provided so as to surround a pixel portion 72, signal line driver circuits 73a and 73b, and scan line driver circuits 74a and 74b which are provided over a first substrate 71. In addition, a second substrate 76 is provided over the pixel portion 72, the signal line driver circuits 73a and 73b, and the scan line driver circuits 74a and 74b. Thus, in addition to a liquid crystal 78, the pixel portion 72, the signal line driver circuits 73a and 73b, and the scan line driver circuits 74a and 74b are sealed by the first substrate 71, the sealant 75, and the second substrate 76. It is preferable that a panel be packaged (sealed) with a protective film (such as an attachment film or an ultraviolet curable resin film) or a cover material with high air-tightness and little degasification so that the panel is not exposed to the outside air, in this manner.

The pixel portion 72, the signal line driver circuits 73a and 73b, and the scan line driver circuits 74a and 74b formed over the first substrate 71 each include a plurality of thin film transistors. A thin film transistor 80 included in the pixel portion 72 and a thin film transistor 79 included in the signal line driver circuit 73a are illustrated as an example in FIG. 7B. In addition, a storage capacitor 81 is also illustrated in the pixel portion 72. The thin film transistors and the storage capacitor described in Embodiment 1 or 2 can be used for the thin film transistors 79 and 80 and the storage capacitor 81. Also the description in Embodiment 1 or 2 can be referred to for each structure of the thin film transistors here.

A variety of signals and potentials are supplied from FPCs 77a and 77b to the signal line driver circuits 73a and 73b, the scan line driver circuits 74a and 74b, or the pixel portion 72.

A connection terminal electrode 82 is formed from the same conductive film from which the pixel electrode layer 83 is formed, and a terminal electrode 84 is formed from the same conductive film from which source and drain electrode layers of the thin film transistor 79 are formed.

The connection terminal electrode 82 is electrically connected to a terminal included in the FPC 77a via an anisotropic conductive film 85.

As the signal line driver circuits 73a and 73b and the scan line driver circuits 74a and 74b, driver circuits may be formed using a single crystal semiconductor film or a polycrystalline semiconductor film over a substrate separately prepared and may be mounted. Alternatively, only the signal line driver circuits or part thereof, or only the scan line driver circuits or part thereof may be separately formed and mounted. This embodiment is not limited to the structure illustrated in FIGS. 7A and 7B.

An example of a structure of a terminal portion in the above active matrix liquid crystal device is illustrated in FIGS. 5A1 and 5A2, and 5B1 and 5B2. Note that in FIGS. 5A1 and 5A2, and 5B1 and 5B2, components common to FIGS. 1A to 1E, FIGS. 2A and 2B, and FIG. 6 maintain the same reference numerals.

FIGS. 5A1 and 5A2 respectively illustrate a cross-sectional view and a top view of the terminal portion of the gate wiring. FIG. 5A1 is a cross-sectional view taken along line C1-C2 of FIG. 5A2. In FIG. 5A1, a conductive layer 15e formed over a stack of the insulating layer 10 and the protective layer 16 is a terminal electrode for connection which functions as an input terminal. Furthermore, in the terminal portion of FIG. 5A1, a first terminal 2d formed of the same material as the gate wiring layer 2c and a connection electrode layer 91 formed of the same material as the source wiring layer 9h overlap with each other with the gate insulating layer 4 interposed therebetween, and are electrically connected to each other through the conductive layer 15e. The conductive layer 15e can be formed using the same light-transmitting material in the same step as the pixel electrode layer 15a.

FIGS. 5B1 and 5B2 are a cross-sectional view and a top view of a source wiring terminal portion, respectively. FIG. 5B1 is the cross-sectional view taken along line C3-C4 of FIG. 5B2. In FIG. 5B1, a conductive layer 15f formed over a stack of the insulating layer 10 and the protective layer 16 is the terminal electrode for connection which functions as an input terminal. In the terminal portion of FIG. 5B1, the electrode layer 2e formed from the same material as the gate wiring layer 2c overlaps with a second terminal 9j which is electrically connected to the source wiring with the gate insulating layer 4 interposed therebetween. The electrode layer 2e is not electrically connected to the second terminal 9j, and a capacitor to prevent noise or static electricity can be formed if the potential of the electrode layer 2e is set to a potential different from that of the second terminal 9j, such as floating, GND, or 0 V. The second terminal 9j is electrically connected to the conductive layer 15f through the insulating layer 10 and the protective layer 16. The conductive layer 15f can be formed using the same light-transmitting material in the same step as the pixel electrode layer 15a.

A plurality of gate wirings, source wirings, common potential lines, and power supply lines are provided depending on the pixel density. Also in the terminal portion, plural first terminals at the same potential as the gate wiring, plural second terminals at the same potential as the source wiring, plural third terminals at the same potential as the power supply line, plural fourth terminals at the same potential as the common potential line, and the like are arranged. The number of each of the terminals may be any number, and the number of the terminals may be determined by a practitioner as appropriate.

Figure 9A:
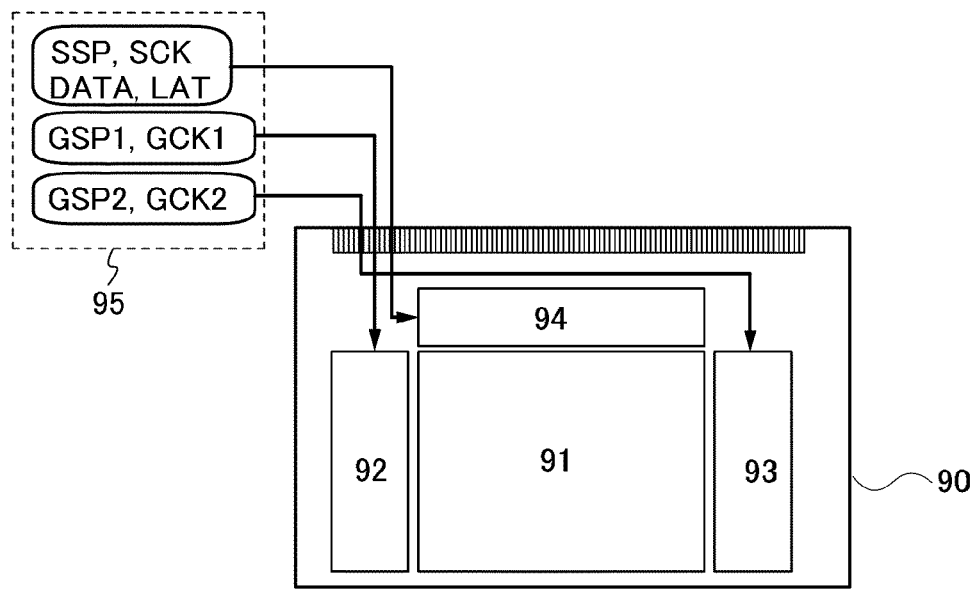
FIGS. 9A and 9B are block diagrams each illustrating an active matrix liquid crystal display device.

Next, described is an example of a block diagram of an active matrix display device having a connection structure as described, with reference to FIG. 9A. The display device includes a pixel portion 91, a first scan line driver circuit 92, a second scan line driver circuit 93, and a signal line driver circuit 94 over a substrate 90. In the pixel portion 91, a plurality of signal lines extended from the signal line driver circuit 94 are placed and a plurality of scan lines extended from the first scan line driver circuit 92 and the second scan line driver circuit 93 are placed.

Note that pixels each including a display element are arranged in matrix in regions where the scan lines and the signal lines intersect with each other. The substrate 90 of the display device is connected to a timing control circuit 95 (also referred to as a controller or a control IC) through a connection portion such as a flexible printed circuit (FPC) or the like.

In FIG. 9A, the first scan line driver circuit 92, the second scan line driver circuit 93, and the signal line driver circuit 94 are formed over the same substrate 90 as the pixel portion 91. Consequently, the number of components of a driver circuit and the like that are externally provided is reduced, so that costs can be reduced. Moreover, the number of connections in the connection portion which are formed when wirings are extended from a driver circuit provided outside the substrate 90 can be reduced, and the reliability or yield can be increased.

Note that the timing control circuit 95 supplies a start signal for the first scan line driver circuit (GSP1) and a clock signal for the scan line driver circuit (GCK1) to the first scan line driver circuit 92, as an example. Furthermore, the timing control circuit 95 supplies, for example, a start signal for the second scan line drive circuit (GSP2) (which is also referred to as a start pulse) and a clock signal for the scan line drive circuit (GCK2) to the second scan line drive circuit 93. The timing control circuit 95 supplies a start signal for the signal line driver circuit (SSP), a clock signal for the signal line driver circuit (SCK), video signal data (DATA) (also simply referred to as a video signal) and a latch signal (LAT) to the signal line driver circuit 94. Note that each clock signal may be a plurality of clock signals whose phases are shifted or may be supplied together with an inverted clock signal (CKB) which is obtained by inverting the clock signal. One of the first scan line driver circuit 92 and the second scan line driver circuit 93 can be omitted.

Figure 9B:
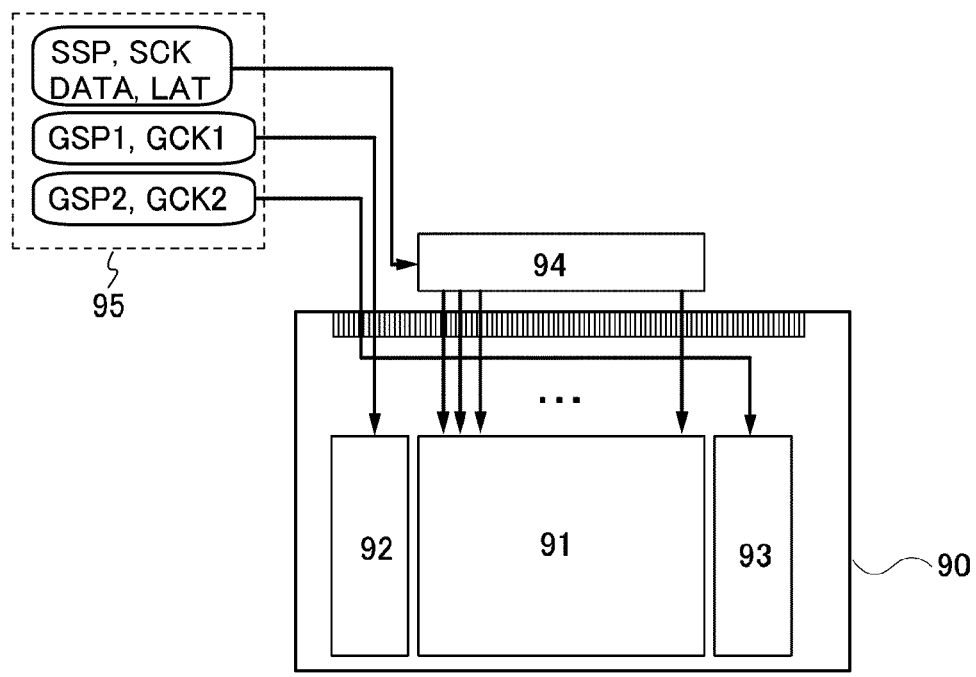

FIG. 9B illustrates a structure in which circuits with lower driving frequency (e.g., the first scan line driver circuit 92 and the second scan line driver circuit 93) are formed over the substrate 90 where the pixel portion 91 is formed, and the signal line driver circuit 94 is formed over a substrate which is different from the substrate 90 where the pixel portion 91 is formed. With such a structure, increase in a size of a display device, high operation of display, and the like can be achieved.

Note that the driver-circuit thin film transistor described in Embodiment 1 is an n-channel thin film transistor. An example of a structure and operation of a signal line driver circuit including the n-channel thin film transistor is described with reference to FIGS. 10A and 10B.

The signal line drive circuit includes a shift register 101 and a switching circuit 102. The switching circuit 102 includes a plurality of switching circuits 102_1 to 102_N (N is a natural number). The switching circuits 102_1 to 102_N each include a plurality of thin film transistors 103_1 to 103_k (k is a natural number). A case in which the thin film transistors 103_1 to 103_k are n-channel transistors is exemplified.

A connection relation in the signal line driver circuit is described taking the switching circuit 102_1 as an example. Drains of the thin film transistors 103_1 to 103_k are connected to signal lines S1 to Sk, respectively. Sources of the thin film transistors 103_1 to 103_k are connected to the signal lines S1 to Sk, respectively. Gates of the thin film transistors 103_1 to 103_k are connected to a wiring 105_1.

The shift register 101 has a function of sequentially outputting H-level signals (also referred to as H signals or signals at high power supply potential level) to the wirings 105_1 to 105_N and sequentially selecting the switching circuits 102_1 to 102_N.

The switching circuit 102_1 has a function of controlling electrical continuity between the wirings 104_1 to 104_k and the signal lines S1 to Sk (electrical continuity between the source and the drain), namely a function of controlling whether or not to supply potentials of the wirings 104_1 to 104_k to the signal lines S1 to Sk. In this manner, the switching circuit 102_1 functions as a selector.

The video signal data (DATA) is input to each of the wirings 104_1 to 104_k. The video signal data (DATA) is often an analog signal that corresponds to image data or an image signal.

Figure 10A:
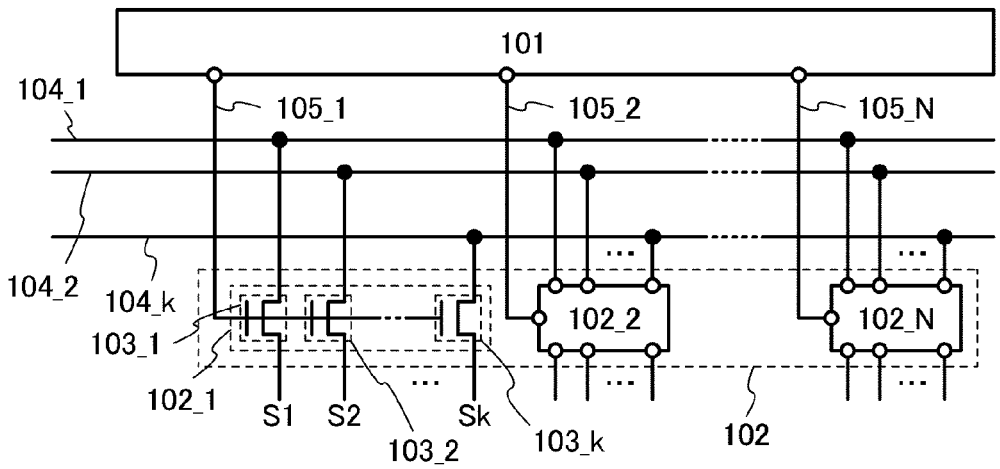
FIG. 10A is a configuration diagram of an active-matrix signal line driver circuit and FIG. 10B is a timing chart describing operation of the active-matrix signal line driver circuit.
Figure 10B:
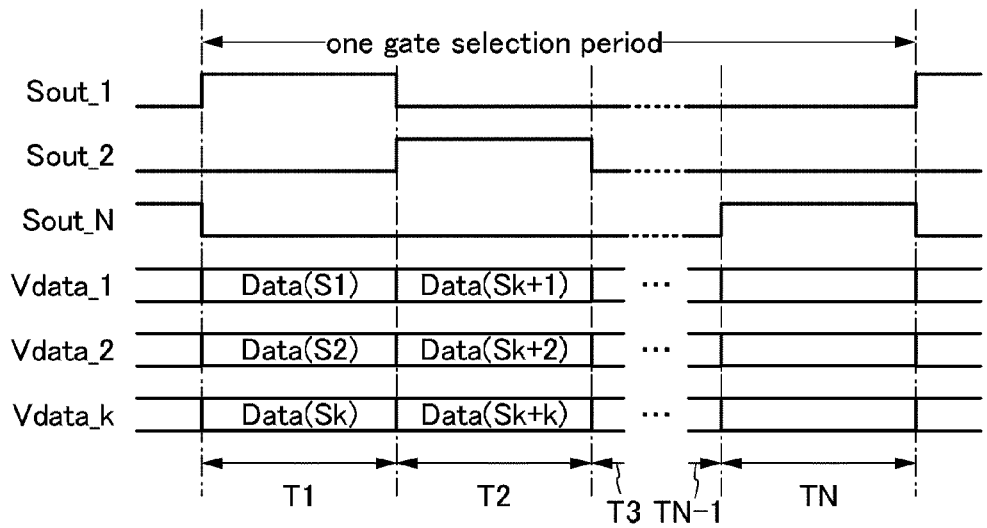

Next, the operation of the signal line driver circuit in FIG. 10A is described with reference to a timing chart in FIG. 10B. FIG. 10B illustrates examples of signals Sout_1 to Sout_N and signals Vdata_1 to Vdata_k. The signals Sout_1 to Sout_N are examples of output signals of the shift register 101, and the signals Vdata_1 to Vdata_k are examples of signals which are input to the wirings 104_1 to 104_k. Note that one operation period of the signal line driver circuit corresponds to one gate selection period in a display device. For example, one gate selection period is divided into periods T1 to TN. Each of the periods T1 to TN is a period for writing the video signal data (DATA) into a pixel in a selected row.

Note that signal waveform distortion and the like in each of the structures illustrated in drawings and the like in this embodiment are exaggerated for simplicity in some cases. Therefore, this embodiment is not necessarily limited to the scale illustrated in the drawing and the like.

In the periods T1 to TN, the shift register 101 sequentially outputs H-level signals to the wirings 105_1 to 105_N. For example, in the period T1, the shift register 101 outputs a high-level signal to the wiring 105_1. Then, the thin film transistors 103_1 to 103_k are turned on, so that the wirings 104_1 to 104_k and the signal lines S1 to Sk are brought into conduction. In this case, Data (S1) to Data (Sk) are input to the wirings 104_1 to 104_k, respectively. The Data (S1) to Data (Sk) are input to pixels in the first to k-th columns in the selected row through the thin film transistors 103_1 to 103_k.

In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signals are written into pixels by a plurality of columns; thus, insufficient writing of video signals can be prevented.

Note that any of the circuits constituted by the thin film transistors in Embodiment 1 or 2 can be used for the shift register 101 and the switching circuit 102. In this case, all the thin film transistors included in the shift register 101 can be n-channel thin film transistors or all the thin film transistors included in the shift register 101 can be p-channel thin film transistors.

Described next is constitution of a scan line driver circuit. The scan line driver circuit includes a shift register. Additionally, the scan line driver circuit may include a level shifter, a buffer, and the like in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One embodiment of a shift register which is used for part of the scan line driver circuit and/or the signal line driver circuit is described with reference to FIGS. 11A to 11D and FIGS. 12A and 12B. The shift register includes first to N-th pulse output circuits 110_1 to 110_N (N is a natural number of 3 or more) (see FIG. 11A).

Figure 11A:
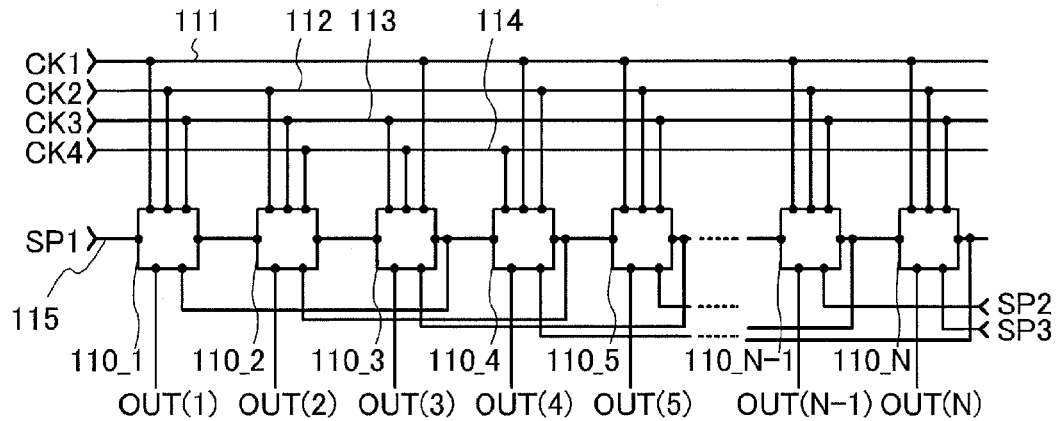
FIGS. 11A to 11D are circuit diagrams showing a configuration of a shift register.

A first clock signal CK1 from a first wiring 111, a second clock signal CK2 from a second wiring 112, a third clock signal CK3 from a third wiring 113, and a fourth clock signal CK4 from a fourth wiring 114 are supplied in the first to N-th pulse output circuits 110_1 to 110_N of the shift register illustrated in FIG. 11A.

In addition, a start pulse SP1 (a first start pulse) from a fifth wiring 115 is input to the first pulse output circuit 110_1. A signal from a pulse output circuit in the previous stage 110_(n−1) (referred to as a previous stage signal OUT(n−1)) (n is a natural number of more than or equal to 2 and lower than or equal to N) is input to the n-th pulse output circuit in the second stage or its subsequent stages 110_n.

To the first pulse output circuit 110_1, a signal from the third pulse output circuit 110_3 of the stage following the next stage is input. Similarly, to the nth pulse output circuit 110_n of the second or its subsequent stage, a signal from the (n+2)th pulse output circuit 110_(n+2) of the stage following the next stage (such a signal is referred to as a subsequent-stage signal OUT(n+2)) is input. Therefore, the pulse output circuits of the respective stages output first output signals OUT(1)(SR) to OUT(N)(SR) to be input to the pulse output circuit of the subsequent stage and/or the pulse output circuit of the stage before the preceding stage and second output signals OUT(1) to OUT(N) to be input to another circuit or the like.

Note that as illustrated in FIG. 11A, since the subsequent stage signal OUT (n+2) is not input to the last two stages of the shift register, a second start pulse SP2 and a third start pulse SP3 may be separately input to the last two stages of the shift register, for example.

Note that a clock signal (CK) is a signal whose level alternates between an H-level and an L-level (also referred to as an L signal or a signal at low power supply potential level) at regular intervals. Here, the first clock signal (CK1) to the fourth clock signal (CK4) are each delayed by ¼ cycle sequentially (i.e., they are 90° out of phase with each other). In this embodiment, by using the first to fourth clock signals (CK1) to (CK4), control or the like of driving of a pulse output circuit is performed. Although the clock signal is also represented by GCK or SCK depending on the driver circuit to which the signal is input, CK is used here.

Figure 11B:
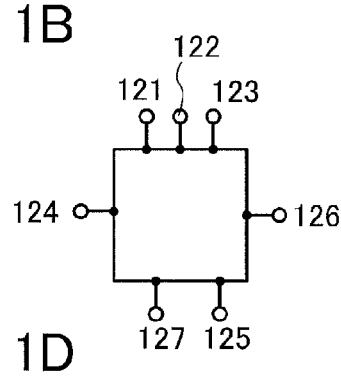

Each of the first to Nth pulse output circuits 110_1 to 110_N includes a first input terminal 121, a second input terminal 122, a third input terminal 123, a fourth input terminal 124, a fifth input terminal 125, a first output terminal 126, and a second output terminal 127 (see FIG. 11B). The first input terminal 121, the second input terminal 122, and the third input terminal 123 are electrically connected to any of first to fourth wirings 111 to 114.

For example, in FIG. 11A, the first input terminal 121 of the first pulse output circuit 110_1 is electrically connected to the first wiring 111, the second input terminal 122 of the first pulse output circuit 110_1 is electrically connected to the second wiring 112, and the third input terminal 123 of the first pulse output circuit 110_1 is electrically connected to the third wiring 113. In the second pulse output circuit 110_2, the first input terminal 121 is electrically connected to the second wiring 112, the second input terminal 122 is electrically connected to the third wiring 113, and the third input terminal 123 is electrically connected to the fourth wiring 114.

In the first pulse output circuit 110_1, the first clock signal CK1 is input to the first input terminal 121; the second clock signal CK2 is input to the second input terminal 122; the third clock signal CK3 is input to the third input terminal 123; a start pulse is input to the fourth input terminal 124; a subsequent stage signal OUT(3) is input to the fifth input terminal 125; the first output signal OUT(1)(SR) is output from the first output terminal 126; and the second output signal OUT (1) is output from the second output terminal 127.

Figure 11C:
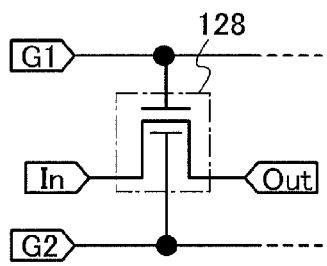

Note that in the first to Nth pulse output circuit 110_1 to 110_N, the thin film transistor including a back gate described in Embodiment 1 can be used besides the thin film transistor with three terminals. FIG. 11C illustrates the symbol of a thin film transistor 128 including a back gate which is described in the above embodiment. The symbol of the thin film transistor 128 illustrated in FIG. 11C represents the thin film transistor including a back gate which is described in Embodiment 1 and is used in the drawings and the like. Note that in this specification, when a thin film transistor includes two gate electrodes with a semiconductor layer therebetween, the gate electrode which is located below the semiconductor layer is also referred to as a lower gate electrode and the gate electrode which is located above the semiconductor layer is also referred to as an upper gate electrode. The thin film transistor 128 is an element which can control electric current between an IN terminal and an OUT terminal with a first control signal G1 which is input to a lower gate electrode and a second control signal G2 which is input to an upper gate electrode.

In the case where an oxide semiconductor is used for a semiconductor layer including a channel formation region of a thin film transistor, the threshold voltage may be shifted in a negative or positive direction depending on a manufacturing process thereof. Thus, it is preferable that the thin film transistor in which an oxide semiconductor is used for a semiconductor layer including a channel formation region have a structure where the threshold voltage can be controlled. The threshold voltage of the thin film transistor 128 illustrated in FIG. 11C can be controlled to be a desired level by providing gate electrodes above and below a channel formation region of the thin film transistor 128 with a gate insulating film interposed between the upper gate electrode and the channel formation region and between the lower gate electrode and the channel formation region, and by controlling a potential of the upper gate electrode and/or a potential of the lower gate electrode.

Next, an example of a specific circuit structure of the pulse output circuit illustrated in FIG. 11B is described with reference to FIG. 11D.

Figure 11D:
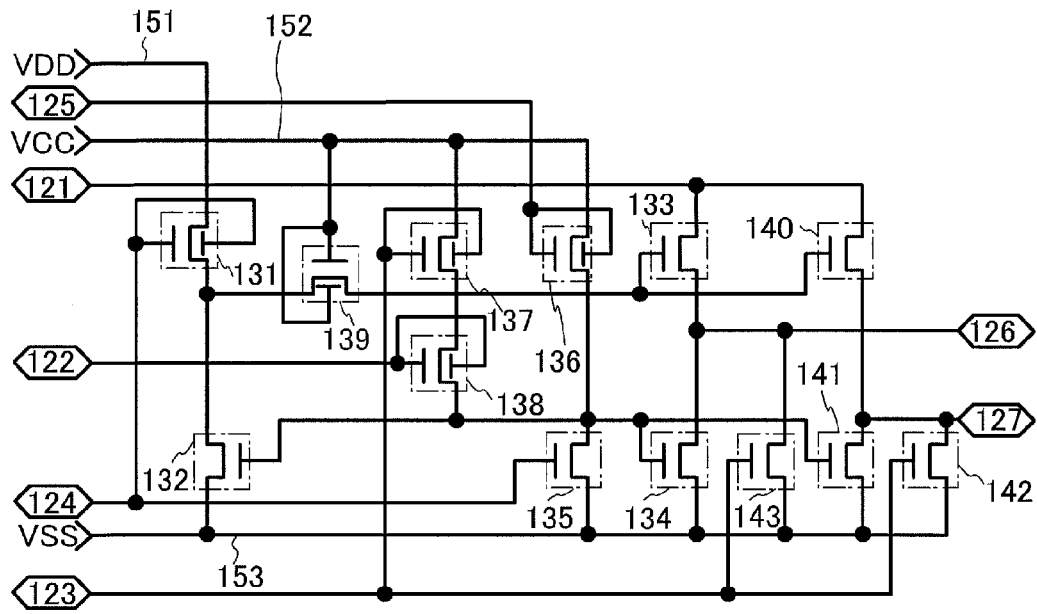

The pulse output circuit 110_1 includes a first to thirteenth transistors 131 to 143 (see FIG. 11D). A signal or a power supply potential is supplied to the first to thirteenth transistors 131 to 143 from a power supply line 151 to which a first high power supply potential VDD is supplied, a power supply line 152 to which a second high power supply potential VCC is supplied, and a power supply line 153 to which a low power supply potential VSS is supplied, in addition to the first to fifth input terminals 121 to 125, the first output terminal 126, and the second output terminal 127, which are described above. The relation of the power supply potentials of the power supply lines in FIG. 11D is as follows: the first power supply potential VDD is higher than or equal to the second power supply potential VCC, and the second power supply potential VCC is higher than the third power supply potential VSS. Although the first to fourth clock signals CK1 to CK4 are signals which oscillate between an H-level signal and an L-level signal at regular intervals, a potential is VDD when the clock signal is at the H level, and the potential is VSS when the clock signal is at the L level. Note that as in FIG. 11D, the thin film transistor 28 including a back gate which is illustrated in FIG. 11C is preferably used as the first transistor 131 and the sixth to ninth transistors 136 to 139 among the first to thirteenth transistors 131 to 143. The first transistor 131 and the sixth to ninth transistors 136 to 139 need to operate so that a potential of a node to which one electrode serving as a source or a drain is connected is switched with a control signal of the gate electrode, and can further reduce a malfunction of the pulse output circuit since response to the control signal input to the gate electrode is fast (the rise of on-state current is steep). By using the thin film transistor 128 including a back gate which is illustrated in FIG. 11C, the threshold voltage can be controlled, and a malfunction of the pulse output circuit can be further reduced. Note that although the first control signal G1 and the second control signal G2 are the same control signals in FIG. 11D, the first control signal G1 and the second control signal G2 may be different control signals.

In FIG. 11D, a drain of the first transistor 131 is electrically connected to the power supply line 151, a source of the first transistor 131 is electrically connected to a drain of the ninth transistor 139, and gate electrodes (a lower gate electrode and an upper gate electrode) of the first transistor 131 are electrically connected to the fourth input terminal 124.

A drain of the second transistor 132 is electrically connected to the power supply line 153, a source of the second transistor 132 is electrically connected to the drain of the ninth transistor 139, and a gate electrode of the second transistor 132 is electrically connected to a gate electrode of the fourth transistor 134.

A drain of the third transistor 133 is electrically connected to the first input terminal 121, and a source of the third transistor 133 is electrically connected to the first output terminal 126. A drain of the fourth transistor 134 is electrically connected to the power supply line 153, and a source of the fourth transistor 134 is electrically connected to the first output terminal 126.

A drain of the fifth transistor 135 is electrically connected to the power supply line 153, a source of the fifth transistor 135 is electrically connected to the gate electrode of the second transistor 132 and the gate electrode of the fourth transistor 134, and a gate electrode of the fifth transistor 135 is electrically connected to the fourth input terminal 124.

A drain of the sixth transistor 136 is electrically connected to the power supply line 152, a source of the sixth transistor 136 is electrically connected to the gate electrode of the second transistor 132 and the gate electrode of the fourth transistor 134, and gate electrodes (a lower gate electrode and an upper gate electrode) of the sixth transistor 136 are electrically connected to the fifth input terminal 125.

A drain of the seventh transistor 137 is electrically connected to the power supply line 152, a source of the seventh transistor 137 is electrically connected to a source of the eighth transistor 138, and gate electrodes (a lower gate electrode and an upper gate electrode) of the seventh transistor 137 are electrically connected to the third input terminal 123.

A drain of the sixth transistor 136 is electrically connected to the gate electrode of the second transistor 132 and the gate electrode of the fourth transistor 134, and gate electrodes (a lower gate electrode and an upper gate electrode) of the sixth transistor 136 are electrically connected to the second input terminal 122.

The drain of the ninth transistor 139 is electrically connected to the source of the first transistor 131 and the source of the second transistor 132, a source of the ninth transistor 139 is electrically connected to a gate electrode of the third transistor 133 and a gate electrode of the tenth transistor 140, and gate electrodes (a lower gate electrode and an upper gate electrode) of the ninth transistor 139 are electrically connected to the power supply line 152, A source of the tenth transistor 140 is electrically connected to the first input terminal 121, a source of the tenth transistor 140 is electrically connected to the second output terminal 127, and the gate electrode of the tenth transistor 140 is electrically connected to the source of the ninth transistor 139.

A drain of the eleventh transistor 141 is electrically connected to the power supply line 153, a source of the eleventh transistor 141 is electrically connected to the second output terminal 127, and a gate electrode of the eleventh transistor 141 is electrically connected to the gate electrode of the second transistor 132 and the gate electrode of the fourth transistor 134.

A drain of the twelfth transistor 142 is electrically connected to the power supply line 153, a source of the twelfth transistor 142 is electrically connected to the second output terminal 127, and a gate electrode of the twelfth transistor 142 is electrically connected to the gate electrodes (the lower gate electrode and the upper gate electrode) of the seventh transistor 137.

A drain of the thirteenth transistor 143 is electrically connected to the power supply line 153, a source of the thirteenth transistor 143 is electrically connected to the first output terminal 126, and a gate electrode of the thirteenth transistor 143 is electrically connected to the gate electrodes (the lower gate electrode and the upper gate electrode) of the seventh transistor 137.

In FIG. 11D, a portion where the gate electrode of the third transistor 133, the gate electrode of the tenth transistor 140, and the source of the ninth transistor 139 are connected to each other is referred to as a node A. Further, the portion where the gate electrode of the second transistor 132, the gate electrode of the fourth transistor 134, the second terminal of the fifth transistor 135, the source of the sixth transistor 136, the drain of the eighth transistor 138, and the gate electrode of the eleventh transistor 141 are connected is referred to as a node B (see FIG. 12A).

Figure 12A:
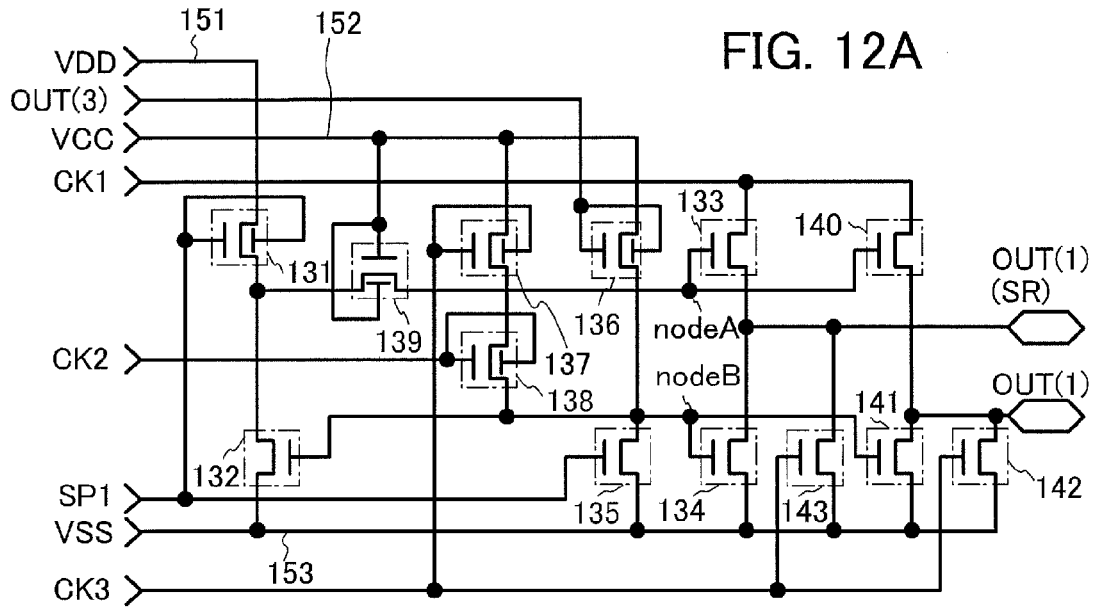
FIG. 12A is a circuit diagram of a shift register and FIG. 12B is a timing chart describing operation of the shift register.

Note that in FIG. 11D and FIG. 12A, a capacitor for performing bootstrap operation by bringing the node A into a floating state may be additionally provided. Furthermore, a capacitor having one electrode electrically connected to the node B may be additionally provided in order to hold a potential of the node B.

Figure 12B:
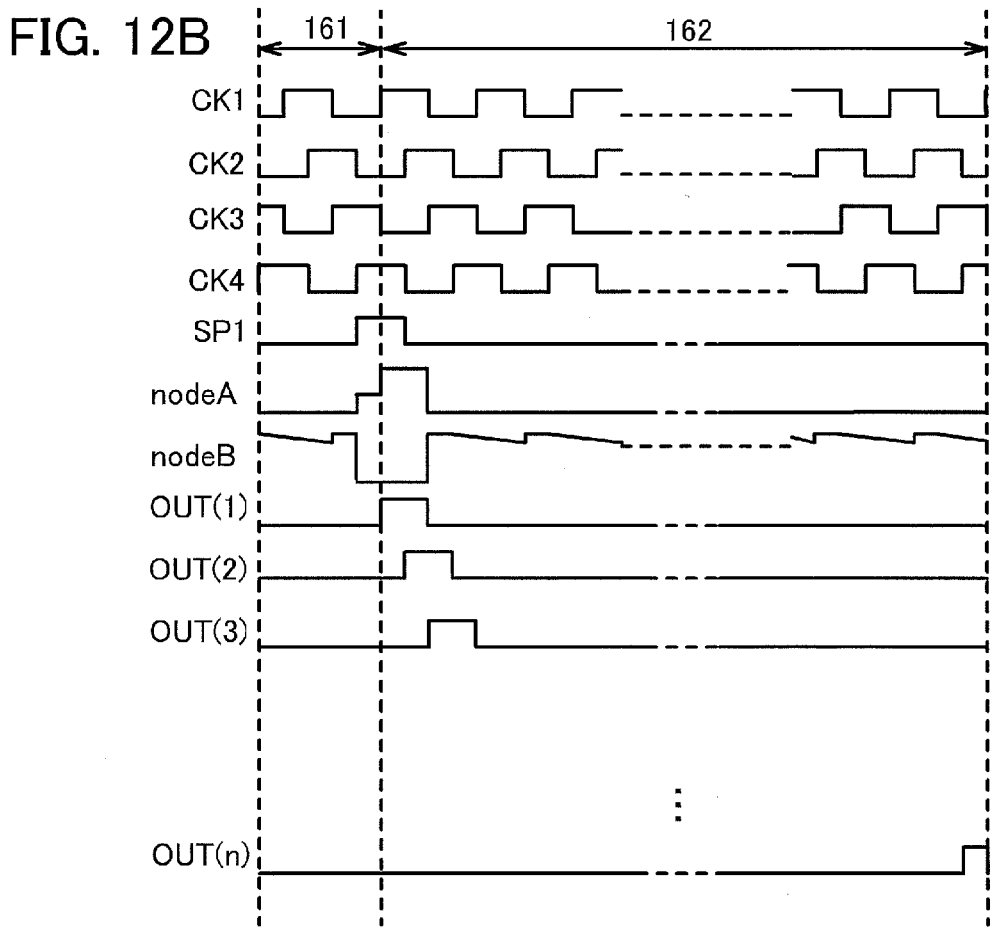

FIG. 12B illustrates a timing chart of a shift register including a plurality of pulse output circuits illustrated in FIG. 12A. Note that when the shift register is included in a scan line driver circuit, a period 161 in FIG. 12B corresponds to a vertical retrace period and a period 162 corresponds to a gate selection period.

Note that as shown in FIG. 12A, by providing of the ninth transistor 139 whose gate is supplied with the second power supply potential VCC, advantages described below are obtained before and after a bootstrap operation.

Without the ninth transistor 139 in which the second power supply potential VCC is applied to the gate electrode, if a potential of the node A is raised by bootstrap operation, a potential of the source which is the source of the first transistor 131 rises to a value higher than the first power supply potential VDD. Consequently, in the first transistor 131, a high bias voltage is applied and thus significant stress is applied between the gate and the source and between the gate and the drain, which might cause deterioration of the transistor.

By providing of the ninth transistor 139 whose gate is supplied with the second power supply potential VCC, the potential of the node A is raised by the bootstrap operation, but at the same time, an increase in the potential of the source of the first transistor 131 can be prevented. In other words, by providing of the ninth transistor 139, a voltage applied between the gate and the source of the first transistor 131 can be reduced. Accordingly, deterioration of the first transistor 131 can be suppressed.

Note that the ninth transistor 139 can be provided anywhere as long as the drain and the source of the ninth transistor 139 are connected to the source of the first transistor 131 and the gate of the third transistor 133 respectively. Note that in the case of the shift register including a plurality of pulse output circuits in this embodiment, in a signal line driver circuit having a larger number of stages than a scan line driver circuit, the ninth transistor 139 can be omitted, and thus, the number of transistors can be reduced.

Note that an oxide semiconductor is used for a semiconductor layer of each of the first to thirteenth transistors 131 to 143, whereby the off-state current of the thin film transistors can be reduced, the on-state current and field effect mobility can be increased, and the degree of degradation of the transistors can be reduced. As a result, a malfunction in the circuit can be reduced.

Moreover, the degree of deterioration of the transistor using an oxide semiconductor by application of a high potential to a gate electrode is smaller than that of a transistor using amorphous silicon. Consequently, similar operation can be obtained even when the first power supply potential VDD is supplied to the power supply line to which the second power supply potential VCC is supplied, and the number of power supply lines placed between circuits can be reduced; thus, the size of the circuit can be reduced.

Note that a similar function is obtained even when the connection relation if FIG. 11D (and FIG. 12A) is changed so that a clock signal that is supplied to the gate electrodes (the lower gate electrode and the upper gate electrode) of the seventh transistor 137 from the third input terminal 123 and a clock signal that is supplied to the gate electrodes (the lower gate electrode and the upper gate electrode) of the eighth transistor 138 from the second input terminal 122 are supplied from the second input terminal 122 and the third input terminal 123, respectively.

Note that by change of the connection relation as the above, in the shift register illustrated in FIG. 12A, a state of the seventh transistor 137 and the eighth transistor 138 is changed so that both the seventh transistor 137 and the eighth transistor 138 are on, then the seventh transistor 137 is off and the eighth transistor 138 is on, and then the seventh transistor 137 and the eighth transistor 138 are off. Accordingly, fall in potential of the node B is caused twice by fall in potentials of the second input terminal 22 (CK2) and the third input terminal 23 (CK3).

In the shift register illustrated in FIG. 12A, when a state of the seventh transistor 137 and the eighth transistor 138 is changed so that both the seventh transistor 137 and the eighth transistor 138 are on, then the seventh transistor 137 is on and the eighth transistor 138 is off, and then the seventh transistor 137 and the eighth transistor 138 are off, the fall in potential of the node B is caused only once, by fall in potential of the gate electrode of the eighth transistor 138.

Therefore, the connection relation, that is, the clock signal CK3 is supplied from the third input terminal 123 to the gate electrodes (the lower electrode and the upper electrode) of the seventh transistor 137 and the clock signal CK2 is supplied from the second input terminal 122 to the gate electrodes (the lower gate electrode and the upper gate electrode) of the eighth transistor 138, is preferable. This is because fluctuation of the potential of the node B can be reduced and noise can be reduced.

In such a manner, an H-level signal is regularly supplied to the node B in a period during which the potentials of the first output terminal 126 and the second output terminal 127 are held at L level; thus, a malfunction of the pulse output circuit can be suppressed.

A liquid crystal display device disclosed in this specification including this embodiment can be applied to a variety of electronic appliances (including a game machine). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 13A:
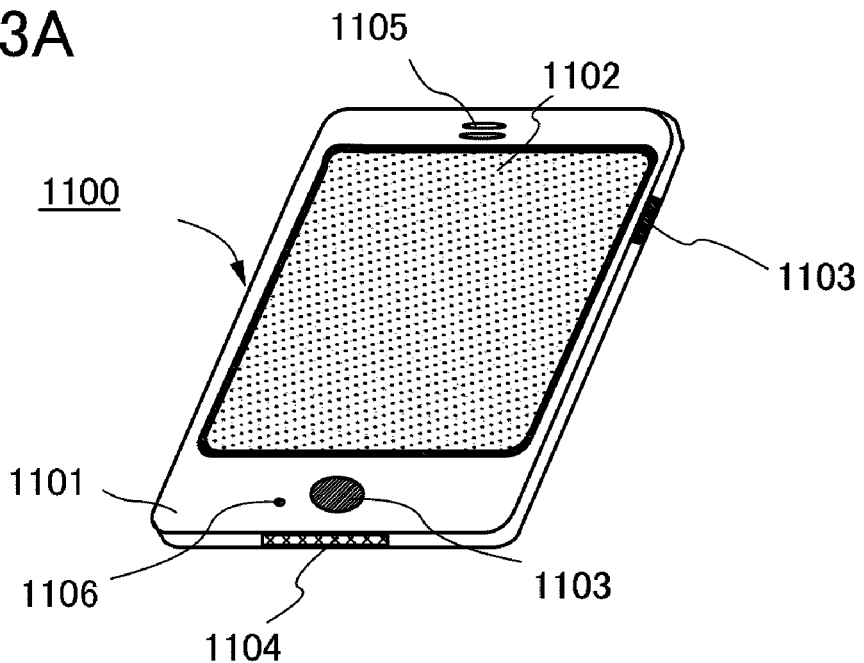
FIGS. 13A and 13B are views each showing an electronic appliance.

FIG. 13A illustrates an example of a mobile phone. A mobile phone 1100 includes a housing 1101, a display portion 1102 incorporated in the housing 1101, an operation button 1103, an external connection port 1104, a speaker 1105, a microphone 1106, and the like.

When the display portion 1102 of the mobile phone 1100 illustrated in FIG. 13A is touched with a finger or the like, data can be input into the mobile phone 1100. In addition, operations such as making calls and composing mails can be conducted when a person touches the display portion 1102 with his/her finger or the like.

There are mainly three screen modes of the display portion 1102. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1102 so that text displayed on a screen can be inputted. In that case, it is preferable to display a keyboard or number buttons on almost all area of the screen of the display portion 1102.

When a detection device including a sensor for detecting inclination, such as a gyroscope or an acceleration sensor, is provided inside the mobile phone 1100, display on the screen of the display portion 1102 can be automatically switched by determining the direction of the mobile phone 1100 (whether the mobile phone 1100 is placed horizontally or vertically for a landscape mode or a portrait mode).

Further, the screen modes are switched by touching the display portion 1102 or operating the operation button 1103 of the housing 1101. Alternatively, the screen modes can be switched depending on kinds of images displayed on the display portion 1102. For example, when a signal of an image displayed on the display portion is a signal of moving image data, the screen mode is switched to the display mode. When the signal is a signal of text data, the screen mode is switched to the input mode.

Further, in the input mode, a signal is detected by an optical sensor in the display portion 1102 and if input by touching the display portion 1102 is not performed for a certain period, the screen mode may be controlled so as to be switched from the input mode to the display mode.

The display portion 1102 may function as an image sensor. For example, an image of a palm print, a fingerprint, or the like is taken by touching the display portion 1102 with the palm or the finger, whereby personal authentication can be performed. Further, by providing a backlight or a sensing light source which emits a near-infrared light in the display portion, an image of a finger vein, a palm vein, or the like can be taken.

A plurality of thin film transistors 13 which is described in Embodiment 1 are arranged in the display portion 1102. Since the thin film transistors 13 have light transmitting properties, they do not block incident light in the case of providing an optical sensor in the display portion 1102 and thus are effective. In addition, also in the case of providing a backlight which emits near-infrared light or a sensing light source which emits near-infrared light in the display portion, the thin film transistors 13 do not block light and thus are effective.

Figure 13B:
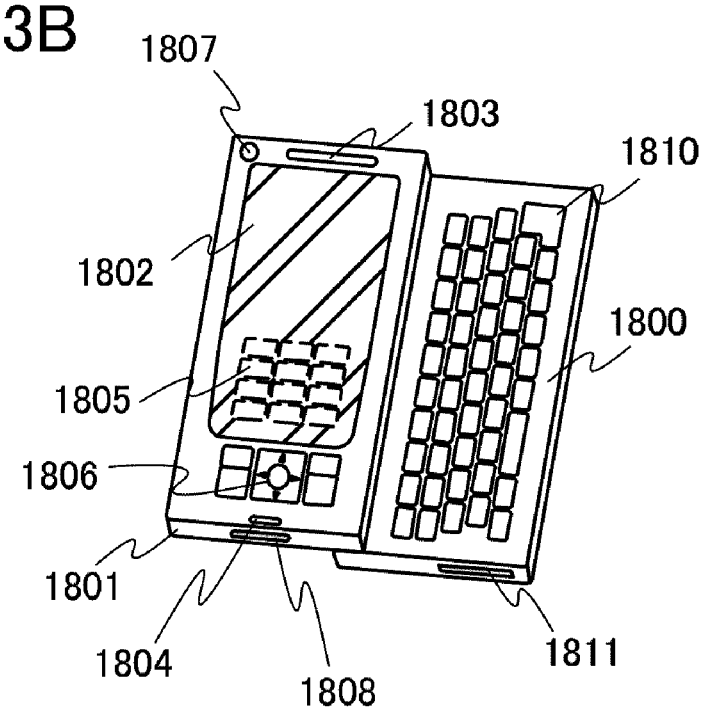

FIG. 13B illustrates another example of a mobile phone. A portable information terminal one example of which is shown in FIG. 13B can have a plurality of functions. For example, in addition to a telephone function, such a portable information terminal can have a function of processing a variety of pieces of data by incorporating a computer.

The portable information terminal illustrated in FIG. 13B has a housing 1800 and a housing 1801. The housing 1800 includes a display panel 1802, a speaker 1803, a microphone 1804, a pointing device 1806, a camera lens 1807, an external connection terminal 1808, and the like. In addition, an antenna is incorporated in the housing 1801.

The display panel 1802 is provided with a touch panel. A plurality of operation keys 1805 which are displayed as images is illustrated by dashed lines in FIG. 13B.

Further, in addition to the above structure, a contactless IC chip, a small memory device, or the like may be incorporated.

The active matrix liquid crystal display device of the present invention can be used for the display panel 1802 and the direction of display is changed appropriately depending on an application mode. Further, the display device is provided with the camera lens 1807 on the same surface as the display panel 1802, and thus it can be used as a video phone. The speaker 1803 and the microphone 1804 can be used for videophone calls, recording, and playing sound, etc. as well as voice calls. Moreover, the housings 1800 and 1801 in a state where they are developed as illustrated in FIG. 13B can shift so that one is lapped over the other by sliding; therefore, the size of the portable information terminal can be reduced, which makes the portable information terminal suitable for being carried.

The external connection terminal 1808 can be connected to an AC adapter and various types of cables such as a USB cable, and charging and data communication with a personal computer are possible. Moreover, a storage medium can be inserted into an external memory slot 1811 so that a large amount of data can be stored and can be moved.

Further, in addition to the above functions, an infrared communication function, a television reception function, or the like may be provided.

As described above, the active matrix display device described in Embodiment 1 or 2 can be provided in a display panel in a variety of electronic appliances as the above. With use of the thin film transistor 12 for a driver circuit and the thin film transistor 13 for a switching element of a display panel, a highly reliable electronic appliance including a display device with high aperture ratio, particularly in the case of a bottom-emission type active matrix display device, can be provided.

Embodiment 4

In this embodiment, an example which is partly different from Embodiment 1 in the manufacturing process of a thin film transistor will be described with reference to FIGS. 8A to 8E. FIGS. 8A to 8E are the same as FIGS. 1A to 1E except for a part of the process, and therefore, the same portions are denoted by the same reference numerals, and specific description of the same portions is omitted.

First, in accordance with Embodiment 1, two kinds of gate electrode layers 2a, 2b, 3a, and 3b, and the gate insulating layer 4 are formed over the substrate 1, and the source electrode layer 5a and the drain electrode layer 5b are formed to partly overlap with the gate electrode layer 3a with the gate insulating layer 4 interposed therebetween. Then, an oxide semiconductor film 6 is formed over the gate insulating layer 4, the source electrode layer 5a, and the drain electrode layer 5b.

Next, the oxide semiconductor film 6 is subjected to dehydration or dehydrogenation. The temperature of first heat treatment for dehydration or dehydrogenation is set at higher than or equal to 400° C., preferably 425° C. or higher. Note that the heat treatment may be performed for one hour or shorter when the temperature thereof is higher than or equal to 425° C., whereas the heat treatment is performed for longer than one hour when the temperature is lower than 425° C.

Here, the substrate is introduced into an electric furnace that is a kind of heat treatment apparatus and heat treatment is performed on the oxide semiconductor film 6 in a nitrogen atmosphere. After that, a high-purity oxygen gas, a high-purity $N_2O$ gas, or an ultra-dry air (with a dew point of −40° C. or lower, preferably −60° C. or lower) is introduced into the same furnace and cooling is performed in such a condition that the oxide semiconductor film 6 is not exposed to air so that reincorporation of water and hydrogen into the oxide semiconductor film 6 is prevented. It is preferable that water, hydrogen, and the like be not included in the oxygen gas or the $N_2O$ gas. Alternatively, the purity of an oxygen gas or a $N_2O$ gas which is introduced into the heat treatment apparatus is preferably 6N (99.9999%) or more, more preferably 7N (99.99999%) or more (i.e., the impurity concentration of the oxygen gas or the $N_2O$ gas is preferably 1 ppm or lower, more preferably 0.1 ppm or lower).

Depending on the conditions of the first heat treatment or the material of the oxide semiconductor, the oxide semiconductor film 6 may be crystallized to be a microcrystalline film or a polycrystalline film in some cases. In the case of a microcrystalline film, it is preferable that the proportion of crystalline component to the whole film is 80% or more (more preferably, 90% or more) and filled so that adjacent microcrystalline grains are in contact with each other. Alternatively, the whole oxide semiconductor film 6 may have an amorphous structure in some cases.

Moreover, after the first heat treatment for dehydration or dehydrogenation, heat treatment may be performed at 200° C. to 400° C. inclusive, preferably 200° C. to 300° C. inclusive, in an oxygen gas atmosphere or a $N_2O$ gas atmosphere.

Through the above steps, the whole oxide semiconductor film 6 is made to be in an oxygen-excess state; accordingly, a high-resistance (i-type) oxide semiconductor film is formed. Although the first heat treatment for dehydration or dehydrogenation is performed just after the formation of the oxide semiconductor film 6 in this embodiment, the first heat treatment for dehydration or dehydrogenation can be performed anytime after the formation of the oxide semiconductor film 6.

Next, the oxide semiconductor film 6 and the gate insulating layer 4 are selectively etched by a photolithography step, so that a contact hole reaching the gate electrode layer 2b is formed. By formation of a resist on the oxide semiconductor film 6, contamination in the interface between the gate insulating layer 4 and the oxide semiconductor film 6 can be prevented. Then, the resist mask is removed (see FIG. 8A).

Figure 8A:
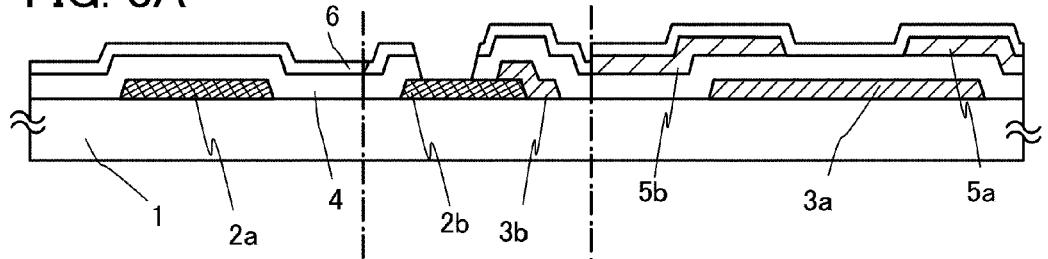
FIGS. 8A to 8E are cross-sectional process views illustrating one embodiment of the present invention.
Figure 8B:
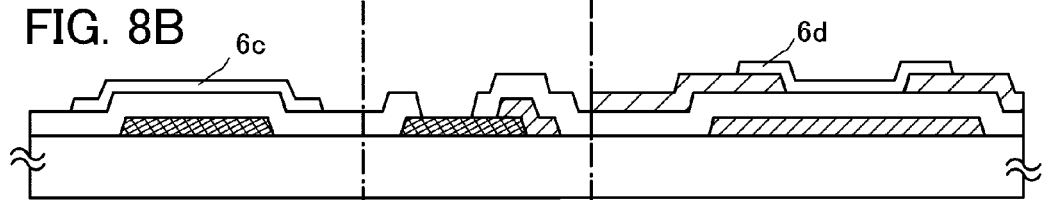
Figure 8C:
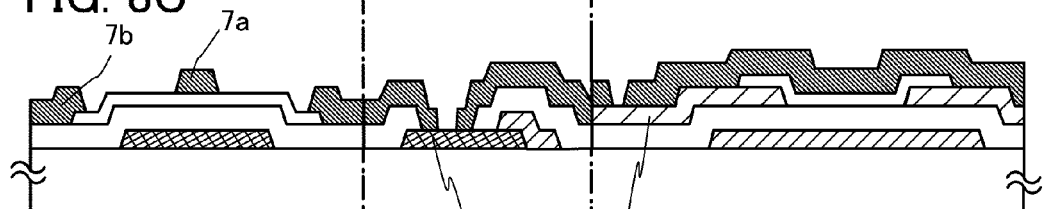

Next, the oxide semiconductor film 6 is selectively etched to obtain island-shaped oxide semiconductor layers 6c and 6d (see FIG. 8B).

Next, an oxide insulating film is formed over the gate insulating layer 4 and the oxide semiconductor layers 6c and 6d by a sputtering method. Then, a resist mask is formed by a photolithography step, and the oxide insulating layers 7a and 7b are formed by selective etching. After that, the resist mask is removed. At this stage, in the oxide semiconductor layer, regions in contact with the oxide insulating layers are formed. The regions include a channel formation region where the gate electrode layer 2a and the oxide insulating layer 7a overlap with each other with the gate insulating layer 4 interposed therebetween. In addition, the oxide semiconductor layer has a region overlapping with the oxide insulating layer 7b which covers the peripheral portion and side surface of the oxide semiconductor layer. By the photolithography step, a contact hole reaching the gate electrode layer 2b and a contact hole reaching the drain electrode layer 5b are also formed (see FIG. 8C).

As the oxide insulating film, an inorganic insulating film which does not include impurities such as moisture, a hydrogen ion, and OH⁻ and blocks entry of these from the outside is used. Typically, a silicon oxide film, a silicon nitride oxide film, an aluminum oxide film, an aluminum oxynitride film, or the like is used.

Next, an oxide conductive film and a metal conductive film are stacked over the gate insulating layer 4, the oxide insulating layers 7a and 7b, and the oxide semiconductor layer. By using a sputtering method, deposition of the stacked layer of the oxide conductive film and the metal conductive film can be performed continuously without exposure to air.

It is preferable that the oxide conductive film contain zinc oxide as its component but do not contain indium. As materials of such an oxide conductive film, zinc oxide, zinc aluminum oxide, zinc aluminum oxynitride, zinc gallium oxide, and the like can be given. In this embodiment, a zinc oxide film is used.

As a material of the metal conductive film, an element selected from Ti, Mo, W, Al, Cr, Cu, and Ta, an alloy containing any of these elements as a component, an alloy containing these elements in combination, or the like is used. The metal conductive film is not limited to a single layer containing the above-described element and may be two or more layers. In this embodiment, a three-layer-stacked film in which a molybdenum film, an aluminum film, and a molybdenum film are stacked is formed.

Next, a resist mask is formed, and the metal conductive film is selectively etched, so that a source electrode layer 23a, a drain electrode layer 23b, a connection electrode layer 23c, and a connection electrode layer 23d are formed. Then, the resist mask is removed. A resist stripper used for removing the resist mask is an alkaline solution, and in the case where the resist stripper is used, the oxide conductive film is selectively etched with the source electrode layer 23a, the drain electrode layer 23b, the connection electrode layer 23c, and the connection electrode layer 23d as masks.

In this manner, an oxide conductive layer 24a is formed under and in contact with the source electrode layer 23a, and an oxide conductive layer 24b is formed under and in contact with the drain electrode layer 23b. By providing the oxide conductive layer 24a between the source electrode layer 23a and the oxide conductive layer, contact resistance can be decreased, which leads to resistance reduction, so that a thin film transistor with high speed operation can be formed. The oxide conductive layer 24a provided between the source electrode layer 23a and the oxide conductive layer functions as a source region, and the oxide conductive layer 24b provided between the drain electrode layer 23b and the oxide conductive layer functions as a drain region, which are effective in improving the frequency characteristics of a peripheral circuit (a driver circuit).

In the case where a molybdenum film and the oxide semiconductor layer are directly in contact with each other, high contact resistance is a problem. This is because Mo is less likely to be oxidized and has a weaker effect of extracting oxygen from the oxide semiconductor layer as compared with Ti, and a contact interface between Mo and the oxide semiconductor layer does not become n-type.

However, even in such a case, the contact resistance can be reduced by interposing the oxide conductive layer 24a between the oxide semiconductor layer and the source electrode layer, and interposing the oxide conductive layer 24b between the oxide semiconductor layer and the drain electrode layer; accordingly, frequency characteristics of the peripheral circuit (the driver circuit) can be improved.

Figure 8D:
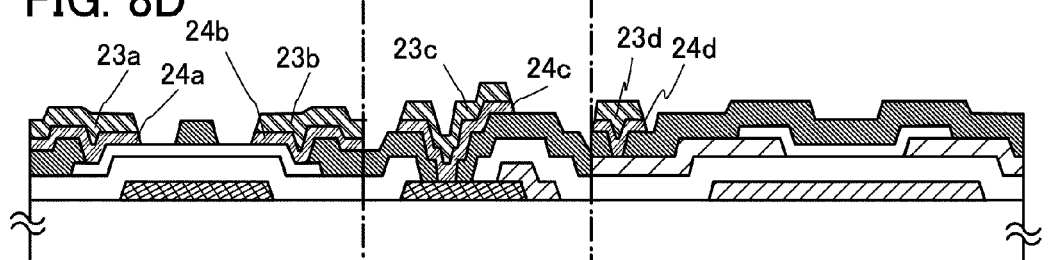

Further, by the same step, an oxide conductive layer 24c is formed under and in contact with the connection electrode layer 23c, and an oxide conductive layer 24d is formed under and in contact with the connection electrode layer 23d (see FIG. 8D). The oxide conductive layer 24c is preferably formed between the connection electrode layer 23c and the gate electrode layer 2b because the oxide conductive layer 24c serves as a buffer, the resistance is only the series resistance depending on the thickness of the oxide conductive layer 24c, which is preferable, and the oxide conductive layer 24c does not form an insulating oxide with the metal, which is preferable.

The etching rate is different between the oxide semiconductor layer and an oxide conductive layer, and therefore, the oxide conductive layer which is on and in contact with the oxide semiconductor layer can be removed by controlling the time of period.

After the metal conductive film is selectively etched, the resist mask may be removed by an oxygen ashing treatment to leave the oxide conductive film, and then, the oxide conductive film may be selectively etched with the source electrode layer 23a, the drain electrode layer 23b, the connection electrode layer 23c, and the connection electrode layer 23d as masks.

In the case where the first heat treatment is performed after the metal conductive film is selectively etched, the oxide conductive layers 24a, 24b, 24c, and 24d are crystallized as long as a crystallization inhibitor such as silicon oxide is not contained in the oxide conductive layers 24a, 24b, 24c, and 24d. On the other hand, the oxide semiconductor layer is not crystallized by the first heat treatment and is kept to be amorphous. Crystals of the oxide conductive layer grow in a columnar shape with respect to a bottom surface. As a result, when the metal film on the oxide conductive layer is etched to form the source and drain electrodes, formation of an undercut in the oxide conductive layer can be prevented.

Next, second heat treatment (preferably at a temperature higher than or equal to 150° C. and lower than 350° C.) may be performed in an inert gas atmosphere or a nitrogen gas atmosphere in order to reduce variations of the electrical characteristics of thin film transistors. For example, heat treatment in a nitrogen atmosphere at 250° C. is performed for one hour. Note that by the second heat treatment, oxygen enters the oxide semiconductor layer and is diffused thereinto from an oxide insulating film in contact with the oxide semiconductor layer or the like. Entry and diffusion of oxygen into the oxide semiconductor enable the channel formation region to have high resistance (the channel region can become i-type). Thus, a normally-off thin film transistor can be obtained. The oxide conductive layers 24a, 24b, 24c, and 24d can be crystallized by the second heat treatment, so that the conductivity can be improved.

Figure 8E:
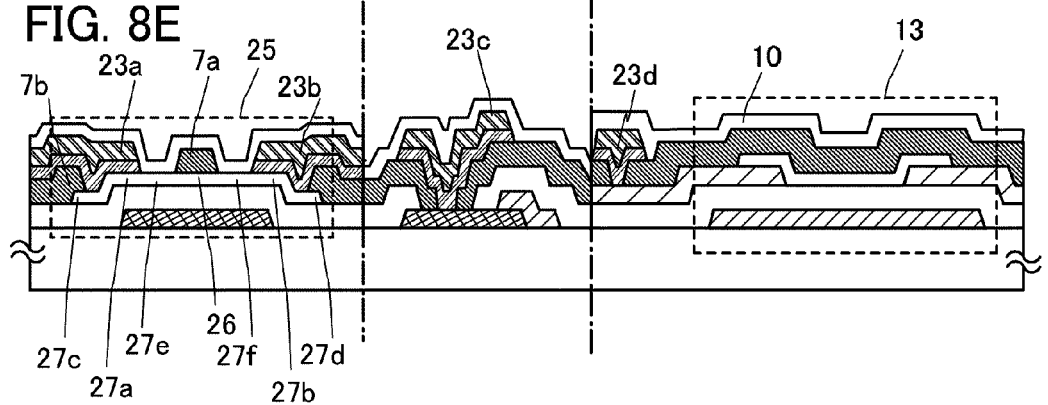

Next, the insulating layer 10 is formed over the oxide insulating layers 7a and 7b, the source electrode layer 23a, and the drain electrode layer 23b (see FIG. 8E).

Through the above steps, a thin film transistor 25 and the thin film transistor 13 can be manufactured over one substrate.

The thin film transistor 25 provided in the driver circuit includes the gate electrode layer 2a, the gate insulating layer 4, the oxide semiconductor layer, the oxide conductive layers 24a and 24b, the source electrode layer 23a, and the drain electrode layer 23b over the substrate 1 having an insulating surface. The oxide semiconductor layer at least includes a channel formation region 26. Further, the oxide insulating layer 7a which is in contact with the channel formation region 26 is provided. The insulating layer 10 is provided over the source electrode layer 23a and the drain electrode layer 23b.

A first region 27c and a second region 27d in the oxide semiconductor layer 6c which is in contact with the oxide insulating layer 7b are in an oxygen-excess state like the channel formation region 26, and serves to reduce leakage current and the parasitic capacitance. A third region 27e in the oxide semiconductor layer 6c which is in contact with the insulating layer 10, is provided between the channel formation region 26 and a high-resistance source region 27a. A fourth region 27f which is in contact with the insulating layer 10 is provided between the channel formation region 26 and a high-resistance drain region 27b. The third region 27e and the fourth region 27f in the oxide semiconductor layer, which are in contact with the insulating layer 10, enable a reduction in off current.

The active matrix substrate obtained in this manner can be combined with a counter substrate to manufacture an active matrix liquid crystal display device as described with reference to FIGS. 2A and 2B in Embodiment 1.

This embodiment can be freely combined with either of Embodiment 2 or Embodiment 3 as appropriate.

This application is based on Japanese Patent Application serial no. 2009-204821 filed with Japan Patent Office on Sep. 4, 2009, the entire contents of which are hereby incorporated by reference.

The invention claimed is:

1. An active matrix liquid crystal display device comprising:
   a pixel portion formed over a substrate, the pixel portion including a first transistor; and
   a driver circuit portion formed over the substrate, the driver circuit portion including a second transistor,
   wherein the first transistor comprises:
      a first gate electrode layer over the substrate;
      a gate insulating layer over the first gate electrode layer;
      a first source electrode layer and a first drain electrode layer over the gate insulating layer;
      a first oxide semiconductor layer which is over the gate insulating layer and overlaps with the first source electrode layer and the first drain electrode layer;
      an oxide insulating layer which is in contact with the first oxide semiconductor layer;
      a connection electrode layer which is connected to at least one of the first source electrode layer and the first drain electrode layer; and
      a pixel electrode layer which is over the oxide insulating layer and electrically connected to the first drain electrode layer,
   wherein the second transistor comprises:
      a second gate electrode layer over the substrate;
      the gate insulating layer over the substrate;
      a second oxide semiconductor layer over the gate insulating layer;
      the oxide insulating layer over the second oxide semiconductor layer; and
      a second source electrode layer and a second drain electrode layer over the oxide insulating layer,
   wherein each of the first gate electrode layer, the gate insulating layer, the first oxide semiconductor layer, the first source electrode layer, the first drain electrode layer, the oxide insulating layer, and the pixel electrode layer has a light-transmitting property, and
   wherein a channel formation region of the second oxide semiconductor layer and a peripheral portion of the second oxide semiconductor layer are in contact with the oxide insulating layer.

2. The active matrix liquid crystal display device according to claim 1,
   wherein a material of the second gate electrode layer, and a material of the second source electrode layer and the second drain electrode layer are different from a material of the first gate electrode layer, a material of the first source electrode layer, and the first drain electrode layer, respectively, and
   wherein the material of the second gate electrode layer, and the material of the second source electrode layer, and the second drain electrode layer are a conductive material with lower resistance than the material of the first source electrode layer and the first drain electrode layer.

3. The active matrix liquid crystal display device according to claim 1, wherein the connection electrode layer is formed from a film containing an element selected from Al, Cr, Cu, Ta, Ti, Mo, and W, as a main component, or a stacked film including an alloy film of any of the elements in combination.

4. The active matrix liquid crystal display device according to claim 1, wherein the second source electrode layer and the second drain electrode layer are formed using the same material as a material of the connection electrode layer.

5. The active matrix liquid crystal display device according to claim 1, wherein the first source electrode layer and the first drain electrode layer are formed using indium oxide, indium tin oxide, indium zinc oxide, or zinc oxide.

6. The active matrix liquid crystal display device according to claim 1, wherein the oxide insulating layer is formed from a silicon oxide film or an aluminum oxide film.

7. The active matrix liquid crystal display device according to claim 1, further comprising:
   an oxide conductive layer provided between the second oxide semiconductor layer and the second source electrode layer and between the second oxide semiconductor layer and the second drain electrode layer.

8. The active matrix liquid crystal display device according to claim 7, wherein the oxide conductive layer comprises the same material as the first source electrode layer and the first drain electrode layer.

9. An active matrix liquid crystal display device comprising:
   a pixel portion formed over a substrate, the pixel portion including a first transistor; and
   a driver circuit portion formed over the substrate, the driver circuit portion including a second transistor,
   wherein the first transistor comprises:
      a first gate electrode layer over the substrate;
      a gate insulating layer over the first gate electrode layer;
      a first source electrode layer and a first drain electrode layer over the gate insulating layer;
      a first oxide semiconductor layer which is over the gate insulating layer and overlaps with the first source electrode layer and the first drain electrode layer;
      an oxide insulating layer which is in contact with the first oxide semiconductor layer;
      a connection electrode layer which is connected to at least one of the first source electrode layer and the first drain electrode layer;
      an insulating layer over the oxide insulating layer and the connection electrode layer; and
      a pixel electrode layer which is over the insulating layer and electrically connected to the first drain electrode layer,
   wherein the second transistor comprises:
      a second gate electrode layer over the substrate;
      the gate insulating layer over the substrate;
      a second oxide semiconductor layer over the gate insulating layer;
      the oxide insulating layer over the second oxide semiconductor layer;
      a second source electrode layer and a second drain electrode layer over the oxide insulating layer;
      the insulating layer over the second oxide semiconductor layer, the oxide insulating layer, the second source electrode layer and the second drain electrode layer; and a conductive layer over the insulating layer which overlaps the second oxide semiconductor layer and the oxide insulating layer, wherein each of the first gate electrode layer, the gate insulating layer, the first oxide semiconductor layer, the first source electrode layer, the first drain electrode layer, the oxide insulating layer, and the pixel electrode layer has a light-transmitting property, and wherein a channel formation region of the second oxide semiconductor layer and a peripheral portion of the second oxide semiconductor layer are in contact with the oxide insulating layer.

10. The active matrix liquid crystal display device according to claim 9, wherein a material of the second gate electrode layer, and a material of the second source electrode layer, and the second drain electrode layer are different from a material of the first gate electrode layer, a material of the first source electrode layer, and the first drain electrode layer, respectively and wherein the material of the second gate electrode layer, and the material of the second source electrode layer, and the second drain electrode layer are a conductive material with lower resistance than the material of the first source electrode layer and the first drain electrode layer.

11. The active matrix liquid crystal display device according to claim 9, wherein the connection electrode layer is formed from a film containing an element selected from Al, Cr, Cu, Ta, Ti, Mo, and W, as a main component, or a stacked film including an alloy film of any of the elements in combination.

12. The active matrix liquid crystal display device according to claim 9, wherein the second source electrode layer and the second drain electrode layer are formed using the same material as a material of the connection electrode layer.

13. The active matrix liquid crystal display device according to claim 9, wherein the first source electrode layer and the first drain electrode layer are formed using indium oxide, indium tin oxide, indium zinc oxide, or zinc oxide.

14. The active matrix liquid crystal display device according to claim 9, wherein the oxide insulating layer is formed from a silicon oxide film or an aluminum oxide film.

15. The active matrix liquid crystal display device according to claim 9, further comprising:

an oxide conductive layer provided between the second oxide semiconductor layer and the second source electrode layer, and between the second oxide semiconductor layer and the second drain electrode layer.

16. The active matrix liquid crystal display device according to claim 15, wherein the oxide conductive layer comprises the same material as the first source electrode layer and the first drain electrode layer.

17. An active matrix liquid crystal display device comprising:

a pixel portion formed over a first substrate, the pixel portion including a first transistor;

a driver circuit portion formed over the first substrate, the driver circuit portion including a second transistor;

wherein the first transistor comprises:

a first gate electrode layer over the first substrate;
a gate insulating layer over the first gate electrode layer;
a first source electrode layer and a first drain electrode layer over the gate insulating layer;
a first oxide semiconductor layer which is over the gate insulating layer and overlaps with the first source electrode layer and the first drain electrode layer;
an oxide insulating layer which is in contact with the first oxide semiconductor layer;
a connection electrode layer which is connected to at least one of the first source electrode layer and the first drain electrode layer; and
a pixel electrode layer which is over the oxide insulating layer and electrically connected to the first drain electrode layer, wherein the second transistor comprises:

a second gate electrode layer over the first substrate;
the gate insulating layer over the first substrate;
a second oxide semiconductor layer over the gate insulating layer;
the oxide insulating layer over the second oxide semiconductor layer; and
a second source electrode layer and a second drain electrode layer over the oxide insulating layer, a second electrode over the first transistor and the second transistor;

a second substrate over the second electrode; and a liquid crystal layer interposed between the first substrate and the second substrate, wherein each of the first gate electrode layer, the gate insulating layer, the first oxide semiconductor layer, the first source electrode layer, the first drain electrode layer, the oxide insulating layer, and the pixel electrode layer has a light-transmitting property, and wherein a channel formation region of the second oxide semiconductor layer and a peripheral portion of the second oxide semiconductor layer are in contact with the oxide insulating layer.

18. The active matrix liquid crystal display device according to claim 17, wherein a material of the second gate electrode layer, and a material of the second source electrode layer, and the second drain electrode layer are different from a material of the first gate electrode layer, a material of the first source electrode layer, and the first drain electrode layer, respectively and wherein the material of the second gate electrode layer, and the material of the second source electrode layer, and the second drain electrode layer are a conductive material with lower resistance than the material of the first source electrode layer and the first drain electrode layer.

19. The active matrix liquid crystal display device according to claim 17, wherein the connection electrode layer is formed from a film containing an element selected from Al, Cr, Cu, Ta, Ti, Mo, and W, as a main component, or a stacked film including an alloy film of any of the elements in combination.

20. The active matrix liquid crystal display device according to claim 17, wherein the second source electrode layer and the second drain electrode layer are formed using the same material as a material of the connection electrode layer.

21. The active matrix liquid crystal display device according to claim 17, wherein the first source electrode layer and the first drain electrode layer are formed using indium oxide, indium tin oxide, indium zinc oxide, or zinc oxide.

22. The active matrix liquid crystal display device according to claim 17, wherein the oxide insulating layer is formed from a silicon oxide film or an aluminum oxide film.

23. The active matrix liquid crystal display device according to claim 17, further comprising:

an oxide conductive layer provided between the second oxide semiconductor layer and the second source electrode layer, and between the second oxide semiconductor layer and the second drain electrode layer.

24. The active matrix liquid crystal display device according to claim 23, wherein the oxide conductive layer comprises the same material as the first source electrode layer and the first drain electrode layer.

25. The active matrix liquid crystal display device according to claim 17, wherein the liquid crystal layer is a material exhibiting a blue phase.

26. A method for manufacturing an active matrix liquid crystal display device comprising the steps of:
forming a first gate electrode layer and a second gate electrode layer over a substrate having an insulating surface;
forming a gate insulating layer over the first gate electrode layer and the second gate electrode layer;
forming a first source electrode layer and a first drain electrode layer over the gate insulating layer to overlap with the first gate electrode layer;
forming an oxide semiconductor film over the first source electrode layer, the first drain electrode layer and the gate insulating layer;
forming a first oxide semiconductor layer and a second oxide semiconductor layer over the gate insulating layer by selectively removing the oxide semiconductor film;
heating the first oxide semiconductor layer and the second oxide semiconductor layer in order to decrease a hydrogen concentration in the first oxide semiconductor layer and the second oxide semiconductor layer;
forming an oxide insulating layer which is over the first oxide semiconductor layer and in contact with a part of the second oxide semiconductor layer and an upper surface and a side surface of the second oxide semiconductor layer;
forming a second source electrode layer and a second drain electrode layer over the second oxide semiconductor layer; and
forming a pixel electrode layer which is over the oxide insulating layer and electrically connected to the first drain electrode layer,
wherein the first oxide semiconductor layer overlaps with the first gate electrode layer, a part of the first source electrode layer, and a part of the first drain electrode layer, and the second oxide semiconductor layer overlaps with the second gate electrode layer, and
wherein a channel formation region of the second oxide semiconductor layer and a peripheral portion of the second oxide semiconductor layer are in contact with the oxide insulating layer.

27. A method for manufacturing an active matrix liquid crystal display device comprising the steps of:
forming a first gate electrode layer and a second gate electrode layer over a substrate having an insulating surface;
forming a gate insulating layer over the first gate electrode layer and the second gate electrode layer;
forming a first source electrode layer and a first drain electrode layer over the gate insulating layer to overlap with the first gate electrode layer;
forming an oxide semiconductor film over the first source electrode layer, the first drain electrode layer and the gate insulating layer;
heating the oxide semiconductor film in order to decrease a hydrogen concentration in the oxide semiconductor film;
forming a first oxide semiconductor layer and a second oxide semiconductor layer over the gate insulating layer by selectively removing the oxide semiconductor film;
forming an oxide insulating layer which is over the first oxide semiconductor layer and in contact with a part of the second oxide semiconductor layer and an upper surface and a side surface of the second oxide semiconductor layer;
forming a second source electrode layer and a second drain electrode layer over the second oxide semiconductor layer; and
forming a pixel electrode layer which is over the oxide insulating layer and electrically connected to the first drain electrode layer,
wherein the first oxide semiconductor layer overlaps with the first gate electrode layer, a part of the first source electrode layer, and a part of the first drain electrode layer, and the second oxide semiconductor layer overlaps with the second gate electrode layer, and
wherein a channel formation region of the second oxide semiconductor layer and a peripheral portion of the second oxide semiconductor layer are in contact with the oxide insulating layer.

* * * * *